(12) United States Patent
Sugita et al.

(10) Patent No.: US 6,344,892 B1
(45) Date of Patent: *Feb. 5, 2002

(54) EXPOSURE APPARATUS AND DEVICE MANUFACTURING METHOD USING SAME

(75) Inventors: Mitsuro Sugita, Utsunomiya; Akiyoshi Suzuki, Tokyo; Takahiro Matsumoto, Utsunomiya, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,710

(22) Filed: Feb. 22, 1999

(30) Foreign Application Priority Data

Feb. 20, 1998 (JP) .............................................. 10-038824
Feb. 3, 1999 (JP) .............................................. 11-026340

(51) Int. Cl.⁷ .............................................. G03B 27/42
(52) U.S. Cl. ...................................................... 355/53
(58) Field of Search ................................. 430/22, 30, 311, 430/322; 356/124, 124.5, 400, 401; 250/491.1, 548; 355/53, 77

(56) References Cited

U.S. PATENT DOCUMENTS

| 4,575,250 A | 3/1986 | Suzuki ........................ 356/401 |
| 4,659,228 A | 4/1987 | Totsuka et al. ............. 356/401 |
| 4,780,615 A | 10/1988 | Suzuki ........................ 250/548 |
| 5,160,957 A | * 11/1992 | Ina et al. ....................... 355/43 |
| 5,309,197 A | 5/1994 | Mori et al. ................... 355/53 |

FOREIGN PATENT DOCUMENTS

| JP | 5-3144 | 1/1993 |
| JP | 6-167308 | 6/1994 |
| JP | 6-204105 | 7/1994 |

* cited by examiner

*Primary Examiner*—Safet Metjahic
*Assistant Examiner*—Etienne LeRoux
(74) *Attorney, Agent, or Firm*—Fitzpatrick, Cella, Harper & Scinto

(57) ABSTRACT

An exposure apparatus includes an exposure device for effecting a multiplex pattern exposure of a photosensitive substrate before development and an alignment device for effecting alignment between the photosensitive substrate and the exposure device using a latent image of an alignment mark formed on the photosensitive substrate before one or some of the pattern exposures of the multiplex exposure. The latent image of the alignment mark is disposed outside a pattern provided by the pattern exposure.

22 Claims, 18 Drawing Sheets

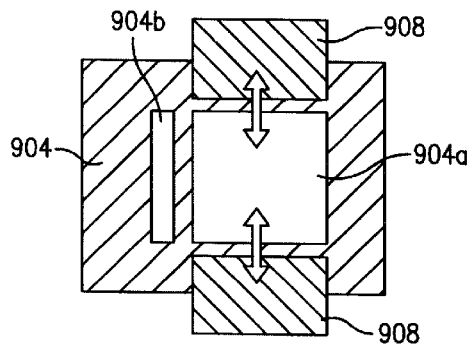
FIG. 10C
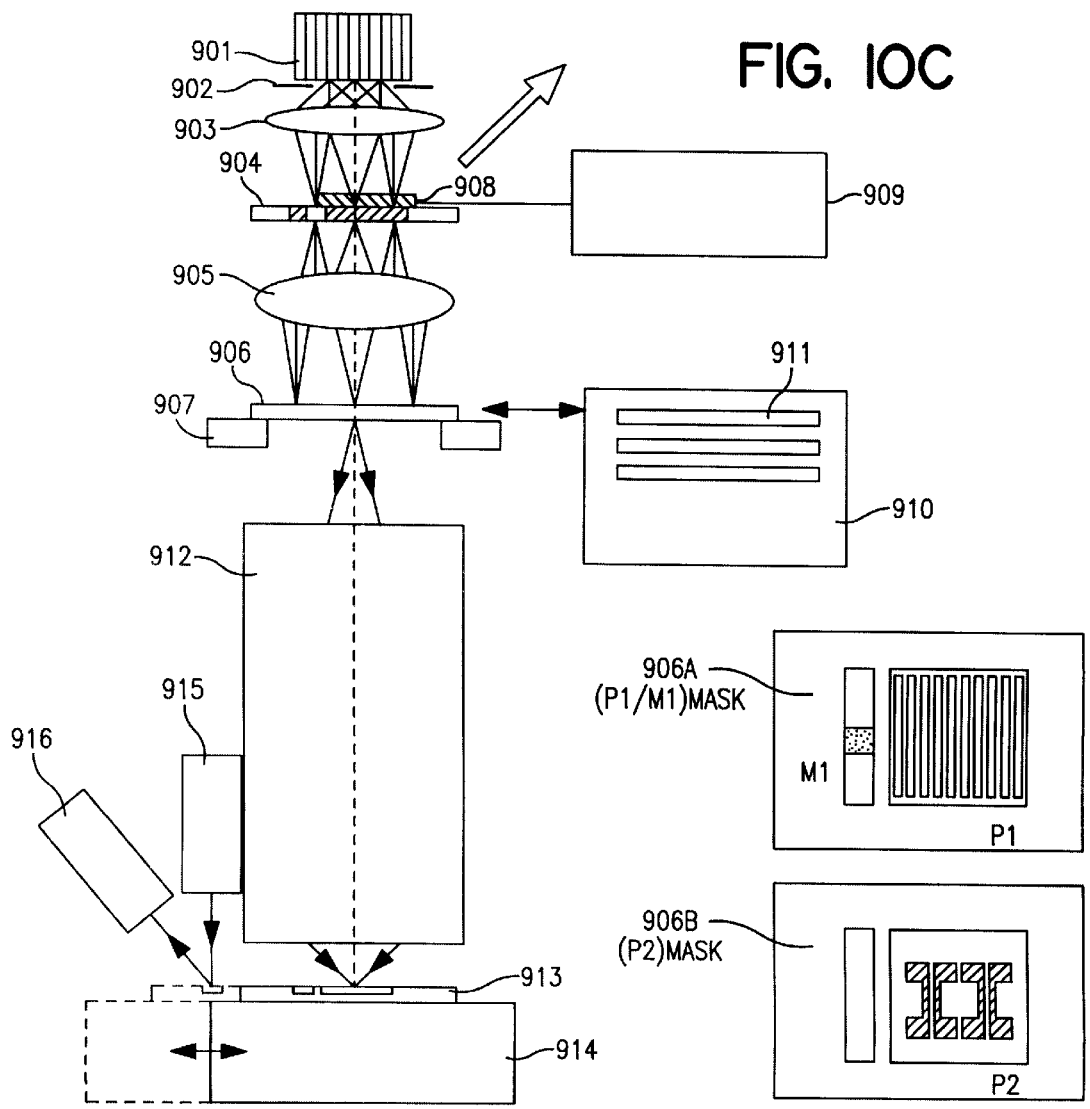
FIG. 10A
FIG. 10B

EXPOSURE APPARATUS AND DEVICE MANUFACTURING METHOD USING SAME

FIELD OF THE INVENTION AND RELATED ART

The present invention relates to an exposure apparatus and a manufacturing method for a device such as a semiconductor element or a liquid crystal element, wherein a photosensitive substrate is exposed to a fine semiconductor circuit pattern such as an LSI pattern or the like. A projection exposure device is conventionally used for manufacturing an IC, an LSI, a liquid crystal element or the like using photolithography, wherein a pattern of a photo-mask or a reticle (mask) is projected onto a substrate such as a wafer, glass plate or the like coated with a photo-resist or the like through a projection optical system.

The increase of the density of the semiconductor device such as an IC, an LSI, a liquid crystal element or the like element is further accelerated. The demand for the fine process of the semiconductor wafer, therefore, increasingly requires finer pattern formation.

In response to such a demand, the projection exposure technique most influential to the fine process technique is intended to form an image of not more than 0.3 µm.

However, it is difficult to form a pattern of not more than 0.15 µm by en exposure device of a projection exposure type using an excimer laser which is currently dominant. The projection optical system involves a limit resulting from an unavoidable trade-off of the optical resolution and the depth of focus determined by the wavelength of the light used. The depth of focus and the resolution of the pattern by the projection exposure device are determined by Rayleigh's equation.

$$R = \kappa_1 (\lambda/NA) \quad (1)$$

$$DOF = \kappa_2 (\lambda/NA^2) \quad (2)$$

Here, $\lambda$ is a wavelength, NA is a numerical aperture representing the brightness of the optical system, $\kappa_1$, $\kappa_2$ are constants determined by the developing process property of the photosensitive substrate, and are normally 0.5–0.7. From these equations (1), (2), the increase of the resolution (reduction of the resolution R) requires the use of a short wavelength light, or a high NA. However, the depth of focus DOF of the projection optical system has to be maintained at a certain level. Therefore, it is impossible to increase the NA beyond a certain level, with the result that reduction of the wave length is the sole Solution.

However, with the reduction of the wave length, no usable glass material is available for the projection optical system. The availability of the glass material is a concern in view of the transmission factor, the durability, the refractive index uniformity, the optical strain, the machinability or the like.

Thus, the reduction of the wavelength is necessary since the equations (1), (2) are ruling in the conventional projection exposure with the result of difficulty in realizing the resolution of not more than 0.15 µm.

As for an exposing type which increases the resolution, overcoming the problems, there are some proposals. In one of them, there is a method wherein multiple exposures each having a low exposure amount not enough for the resist to sense, are carried out, with different exposure patterns, so that the amount of exposure of the portion s superimposedly exposed are enough for the resist to be sensitive, by which fine patterns are formed. In such a method, the accuracy in the alignment between or among the exposure patterns is an important disassembly meter. However, such a method is not yet firmly in practice.

The alignment accuracy between the exposures in the multiplex exposure, has to be maintained high.

SUMMARY OF THE INVENTION

Accordingly, it is a principal object of the present invention to provide an apparatus and a method which are capable of manufacturing high accuracy and high density devices, and a mask therefor.

These and other objects, features and advantages of the present invention will become more apparent upon a consideration of the following description of the preferred embodiments of the present invention take in conjunction with the accompanying drawings.

BRIEF DESCRIPTION OF THE DRAWINGS

FIGS. 10(A) to 10(C) are structural schematic views of an exposure device according to a third embodiment of the present invention.

DESCRIPTION OF THE PREFERRED EMBODIMENTS

In the first embodiment, the use is made with a multiplex exposure including a plurality Of two-beam interference exposures and projection exposures, wherein alignment is effected by the use of a latent image of an alignment mark, by which the alignment accuracy which is equivalent to the normal exposure is accomplished. The formed latent image per se of the alignment mark is detected, and alignment control is carried out on the basis of the signal of the detection in the next exposure step. According to the latent image detection of the alignment mark, a high accuracy alignment is accomplished at all times irrespective of the conditions of the wafer, and in addition, since the latent image is formed with the pattern exposure, the error includes only the error detection between the two steps and the error in the control (i.e., only the error peculiar to the apparatus) δE, so that registration error is the same as in a normal exposure device.

In the projection exposure, the alignment mark can be transferred onto a desired position by using a mask having an alignment mark, so that in the following embodiments, the alignment mark is formed in the projection exposure step. With two beam interference exposure, only a wide periodical one dimensional stripe pattern can be formed, and therefore, in order to transfer an alignment mark which is usually in the form of a two dimensional fine region pattern, an apparatus for forming the alignment mark is additionally required.

Figure 5:
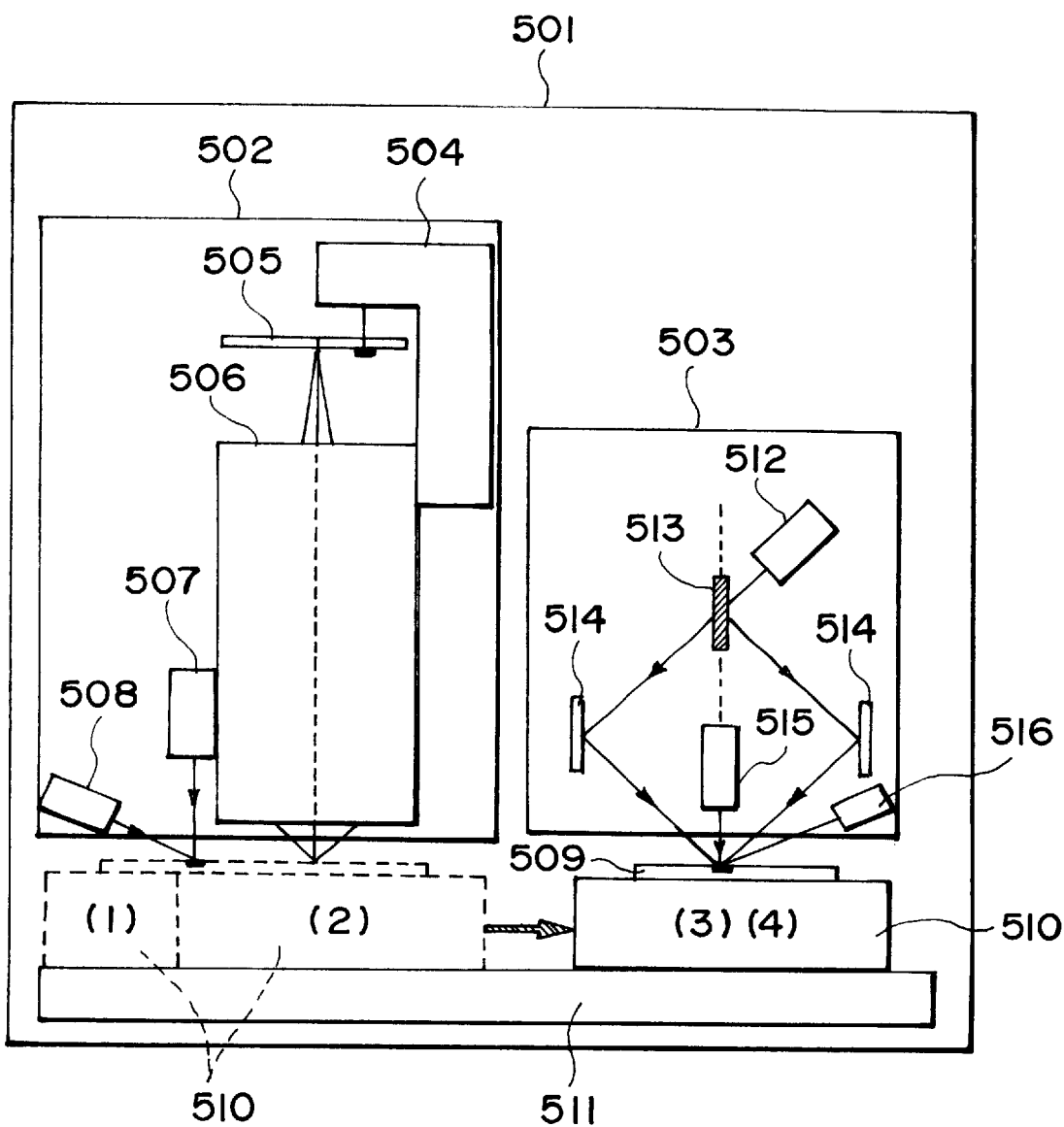
FIG. 5 is a structural schematic view of a first embodiment of an exposure device according to the present invention.
Figure 6:
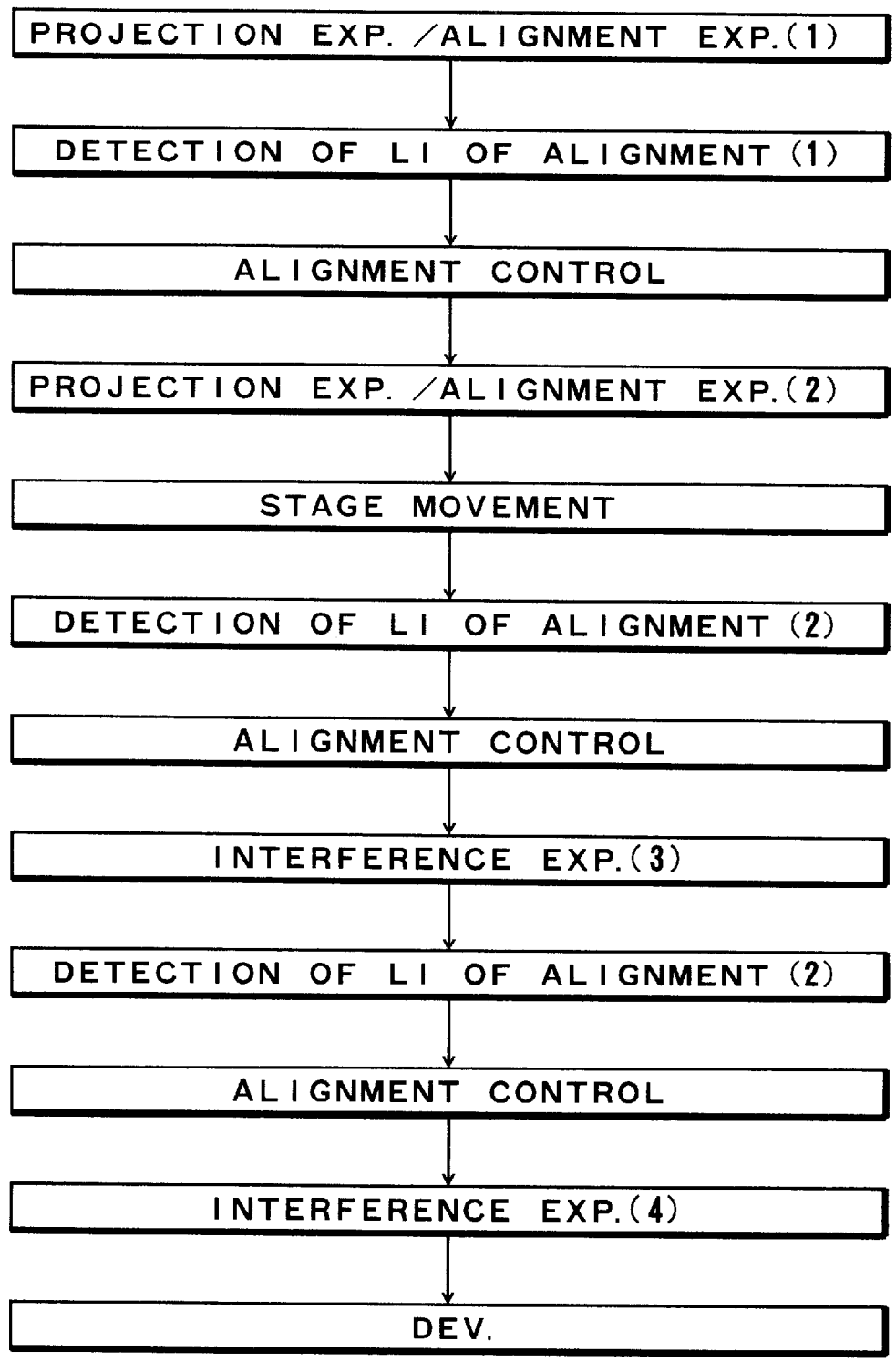
FIG. 6 is a f low chart of an example of an operation step according to a first embodiment of the present invention.

The description will be made as to an exposure device using an alignment apparatus according to a first embodiment. FIG. 5 schematically shows an exposure device using the alignment apparatus according to the first embodiment of the present invention, and FIG. 6 is a flow chart illustrating an example of operation steps used in the apparatus. In FIG. 5, designated by 501 is a main assembly of the exposure device; 502 is a projection exposure portion; 503 is a two beam interference exposure portion, and for each of the exposure portions, a wafer 509, a wafer stage 510 and a wafer stage base 511 are commonly used. The wafer stage 510 and the wafer 509 are moved on the wafer stage base 511 in accordance with the aligning operation and the exposing operation in the respective exposure portions. For example, it is carried out in the order of (1) projection exposure alignment, (2) projection exposure, (3) two beam interference exposure alignment and (4) two beam interference exposures. FIG. 5 shows the positions of the wafer stage 510 in each step of the operation by (1)–(4). Each exposure operation will be described.

In the projection exposure portion 502, an image of the mask 505 illuminated with an unshown light source is formed on the wafer 509 through the projection optical system 506. Before the projection exposure, an alignment mark for mask alignment provided at a predetermined position on the mask 505 is detected by a detection device 504 for the mask alignment, and on the basis of the result of the detection, the mask is placed at a predetermined position using mask position control means.

The wafer 509 has a predetermined latent image of an alignment mark determined by an alignment tree which will be described hereinafter, and the latent image is illuminated by an illumination means 507 for the alignment, and resulting diffracted light is detected by alignment light detecting means 508 to determine a correct position of the wafer. On the basis of the position information, the position of the wafer stage 510 is controlled by unshown wafer position control means, so that the water is placed at the predetermined exposure position.

Use may be made with an off-axis alignment microscope far the alignment between the wafer, stage reference and the mask or the like, or another L side or R side alignment system, although they are not shown. The detailed description thereof is omitted for simplicity because they are not directly related with the present invention. In the two-beam interference exposure portion 503, the exposure light from the light source 512 is split into two beams by an optical wave splitter 513, and the beams are folded back by a mirror 514 to be incident onto the wafer 508 at a predetermined angle. The two beams are interfered to form an exposure pattern with a predetermined period.

The diffracted light resulting from the illumination of the alignment mark latent image by the illumination means 515 for the alignment is detected by an alignment light detecting means 516 disposed at a predetermined angle to determine the position. On the basis of the result of the detection, the position of the wafer stage 510 is controlled by an unshown wafer position control means, so that the wafer is placed at a predetermined exposure position.

As for the detection method for the alignment mark which is in the form of a latent image, there are a method wherein a change of diffracted or reflected light by a scanning spot light with the use of a difference in the refractive index or surface step resulting from volume expansion/contraction between the non-exposed portion and the exposed portion of the photoresist, and a method wherein an image of the surface is formed, and the image is processed for detection. Examples of the alignment using the latent image in an exposure device are disclosed in Japanese Laid-open Patent Application No. HEI-5-3144, Japanese Laid-open Patent Application No. HEI-6-204105 or Japanese Laid-open Patent Application No. HEI-6-167308 for example.

Figure 3:
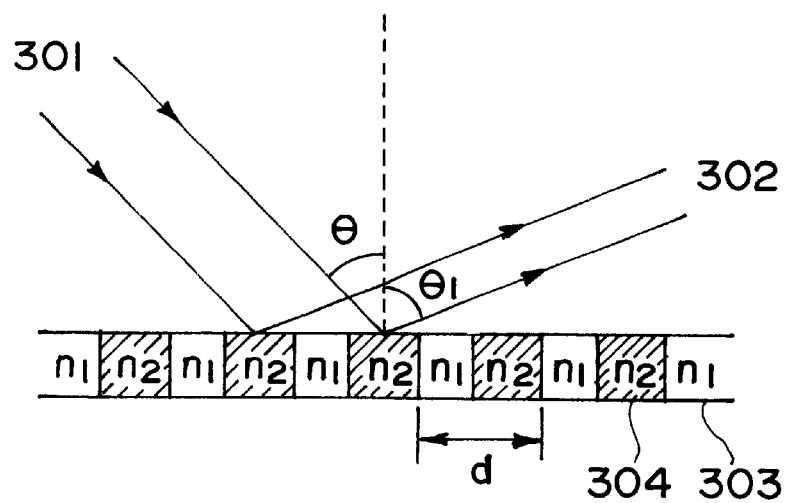
FIG. 3 is a schematic view illustrating a detection principle of an alignment mark latent image.
Figure 4:
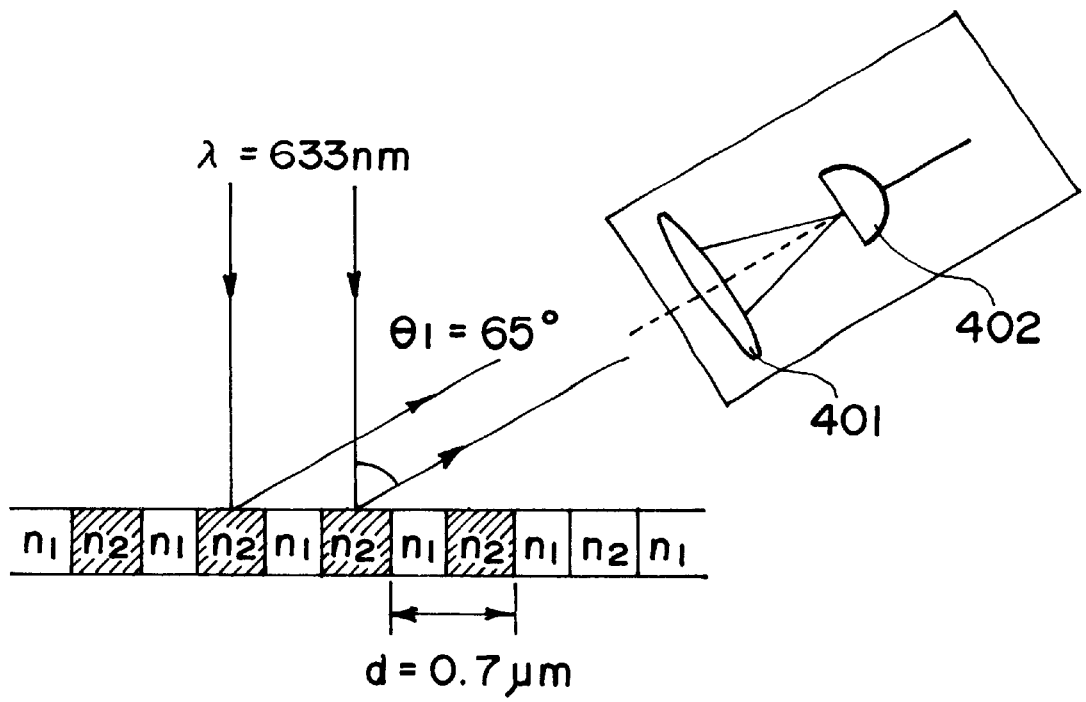
FIG. 4 is a schematic view showing an example of detection of the alignment mark latent image.

Referring to FIG. 3, the description will be made as to an alignment mark latent image detection method of a diffraction grating type using the refractive index change. In this Figure, an alignment mark is projected onto the resist on the wafer, and the refractive index of the portion exposed to the alignment mars becomes n1, and the refractive index of the non-exposed portion becomes n2. When the period of the alignment mark is d, the mark is considered as being a diffraction grating having a period d of a refractive index change. When the diffraction grating is exposed to a coherent laser beam, the diffracted light results with the condition of $d(\sin\theta 1 \pm \sin\theta) = m\lambda$. Here, θ is an incident angle of the incident light to the wafer, and θ1 is an emergent angle of the emergent light. And, m is the order of diffraction wherein a plus sign means the direction at the reflecting side, and the minus sign means the incident beam side. Using the diffracted light by the diffraction grating, the alignment mark can be detected. For example, when the primary diffraction light is detected, and θ=90°, d=0.7 μm, wavelength=633 nm, then θ1 is approx. 65°. A detection device is placed in the direction of 65 degrees, as shown in FIG. 4, and the wafer is scanned with the vertical illumination, the diffracted light results only when the mark is under the illumination, and the detection device produces a signal. By detecting the high and low of the signal, the position of the mark can be determined.

Figure 1:
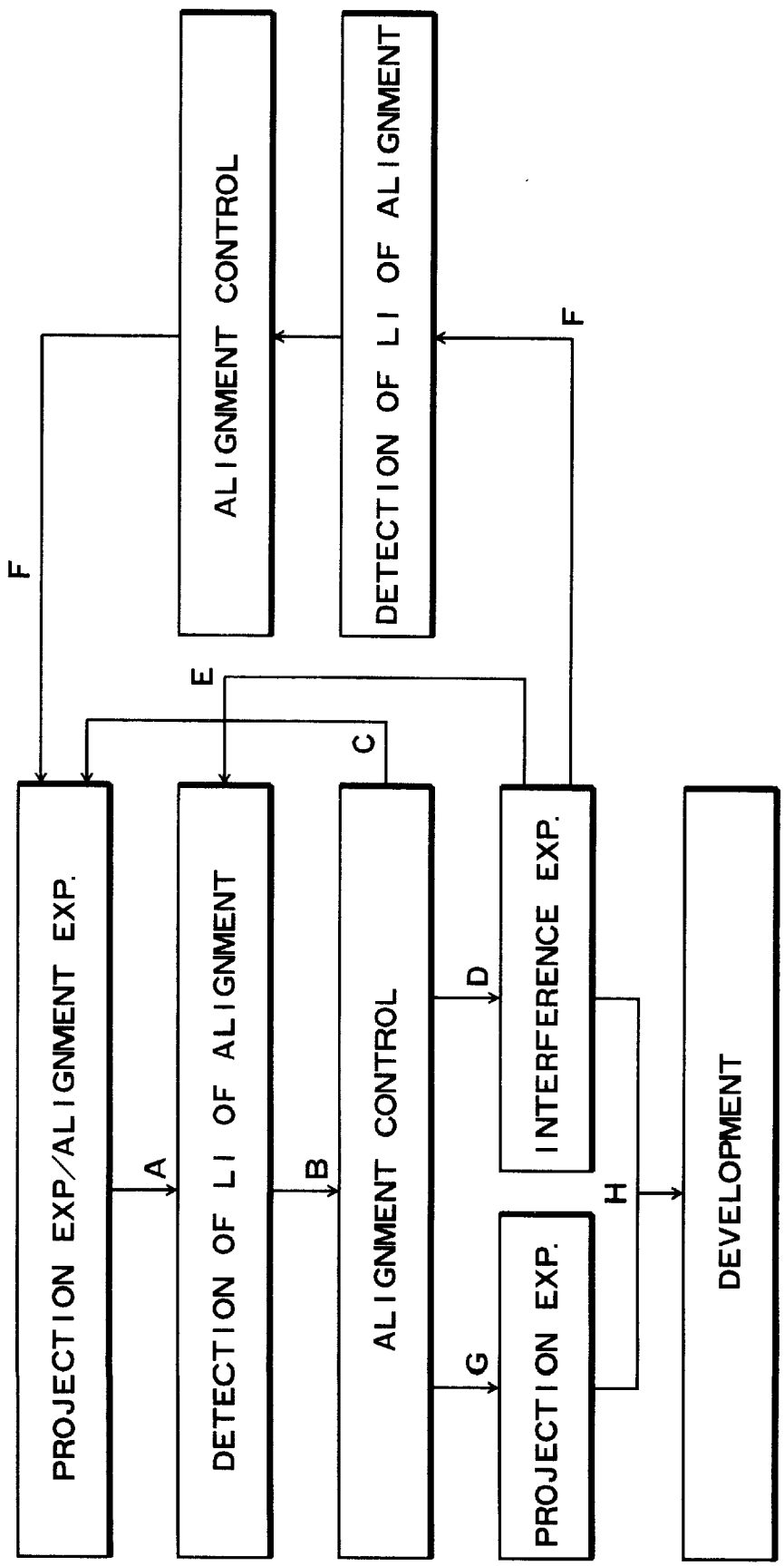
FIG. 1 is a flow chart of a principal operation in a first embodiment of the present invention.

Referring to FIG. 1, there is shown a flow chart of an exposure operation using a combined two-beam interference exposure and projection exposure using the alignment method in this embodiment. The flow chart will be described in detail. The arrows A–H will be mainly explained.

First, a projection exposure and alignment mark exposure step is carried out. In the step, the exposure pattern and the alignment mark outside the exposure pattern are simultaneously exposed through projection exposure. At this time, the alignment accuracy is better if the alignment mark is closer to the exposure pattern. Hereinafter, the projection exposure of the exposure pattern will be called projection exposure, and the projection exposure of the alignment mark is called alignment mark exposure.

1A) Then, in the alignment mark latent image detection step, the alignment mark latent image formed in the previous step is detected to determine the position thereof.

(B) Then, in the alignment control step, exposure position control for the next exposure is carried out on the basis of the result of the detection.

(C) When the next step is a projection exposure which is not the final exposure, the operation returns to the projection exposure and alignment mark exposure step, wherein the exposure is carried out at the exposure position after the alignment control.

(D) When the next step is a two-beam interference exposure, two-beam interference exposure is carried out at the exposure position after the alignment control.

(E) When the next step is a two-beam interference exposure again, the operation returns to the alignment mark latent image detection step, and the detection is carried out using the alignment mark formed by the previous projection exposure and alignment mark exposure step.

(F) When the next exposure is a projection exposure and not the final exposure, the alignment mark formed in the previous projection exposure and alignment mar exposure stay is used, and the alignment mar latent image detection step and the alignment control step are carried out, and then, the operation returns to the projection exposure alignment mark exposure step, and the exposure is carried out at the exposure position after the alignment control.

(G) When it is the final projection exposure, the alignment mark is not formed, only the pattern exposure is carried out as the projection exposure step.

(H) When the projection exposure or the two-beam interference exposure is for the final exposure, the photosensitive substrate having been subjected to the multiple exposure is developed (developing step). In the development step, a post-process such as a PEB (Post-Exposure Bake) or the like may be carried out as well as usual developing operation. Although not shown, after the development step, an etching process and the like are carried out to form the physical pattern. Through such known steps, the devices such as semiconductor elements or liquid crystal elements or the like are manufactured.

This is the basic flow of operations.

Referring back to FIG. 5, an example of the operation will be described in an apparatus.

First, an initial exposure is carried out by projection exposure. At this time, an alignment mark is formed adjacent to the exposure pattern portion on the mask to permit the simultaneous exposure of the pattern and the alignment mark. The mask, for the first exposure, having the exposure pattern and the alignment mark, is placed in the projection exposure portion 502, and the wafer stage 510 is placed at the position (2), and then an alignment control operation is carried out using a known alignment method, and then, the wafer 509 is subjected to the projection exposure and the alignment mark exposure.

Then, when the projection exposure is to be carried out again, the latent image of the first alignment mark is detected, and on the basis of the result of the detection, alignment control is effected for the second exposure, and after that, the second exposure is carried out. More particularly, the water stage 510 is placed at the position (1), and the alignment mark latent image on the wafer 509 is illuminated by the illumination means 507 for alignment. The diffracted light is detected by the alignment light detecting means 508 to correctly determine the position of the wafer. On the basis of position information, the wafer stage 510 is placed at the position (2), and the position thereof is controlled by wafer position control means to place the wafer at a precise position. The mask of the second exposure is placed at the predetermined position by an unshown mask exchanging apparatus and mask position adjusting means. For the second projection exposure, similarly to the first exposure, the mask has a second alignment mark adjacent to the second exposure pattern portion, which are projected simultaneously.

In the projection exposure, the alignment mark is projected simultaneously except for the final exposure. The alignment mark is formed adjacent to the exposure pattern portion on the mass 505 at a predetermined magnification. When the exposure is to be carried out using two-beam interference exposure portion 503, the stage is moved to the two-beam interference exposure portion from the projection exposure portion after the completion of the second projection exposure. After the movement of the stage, the latent image of the alignment mark is detected, and on the basis of the result of the detection, the alignment control is carried out for the third exposure, and then the two-beam interference exposure is executed. More particularly, the wafer stage 510 is placed at the position (3), and then the alignment control is carried out. Here, the alignment mark latent image is illuminated by the illumination means 515 for alignment, and the resultant diffracted light is detected by the alignment light detecting means 516 to determine the position, and on the basis of the determined position, the position of the wafer stage 510 is controlled, so that the wafer is placed at a predetermined exposure position(4) (which is close to the position (3)). The exposure light from the light source 512 is projected onto the wafer 508 through the optical wave splitter 513 and by way of a mirror 514 to effect two-beam interference by which a predetermined exposure pattern having a predetermined period is formed on the wafer 509.

In the two-beam interference exposure portion, two split exposure beams do not pass the space in the vertical direction relative to the exposure surface at the exposure position, so that an alignment portion can be disposed very close to the exposure portion, and therefore, the alignment can be effected at a position very close to the wafer position during the exposure operation. Accordingly, as is contrasted to a usual off-axis system, a large base line (reference positional deviation) or a long distance stage movement is required. A part of the alignment optical system 515, 516 can be commonly used with the exposure optical system 513, 514. When the two-beam interference exposure is carried out again, the above-described operations are repeated. However, the alignment mark latent image to be used is the latest one.

When the final exposure is completed, the wafer has been subjected to two projection exposures, and two-beam interference exposure operations, so that exposure pattern are superimposed. The wafer 509 is taken out of the water stage 510 using a known system, and then the developing process is carried out. The wafer is developed by which the patterns formed. The developing operation may include the PEB processing or the like. After the development, the etching or other processes are carried out. For example, the pattern is formed through the etching process or the like. The circuit or the like is provided by such a pattern formation, and the semiconductor element or the liquid crystal element or the like is manufactured. For these processes, known methods are usable. FIG. 6 shows the operation steps for the above-described exposure operation. Here, the steps are indicated by numerals, and the same numerals are assigned to the alignment mark latent images formed by the steps.

In this embodiment, the pattern exposure is effected by multiplex exposure before the development, and the latent image of the alignment mark is formed separately from the exposure pattern, and the thus formed alignment mark is used for the alignment during the pattern exposure after the mark formation. When the multiplex exposure is carried out without the use of an alignment mark on a bare wafer not having any pattern or for the reason of surface state of the wafer, the alignment error between or among the exposures would be large. For the alignment mark, a latent image mark is formed separately from the exposure pattern in this embodiment, and on the basis of the latent image, the alignment is effected before the exposure, by which the multiplex exposure is accomplished with high alignment accuracy between or among the multiple exposure pattern by the use of the alignment mark exclusively for the alignment, even if the wafer is under such a condition.

Figure 2A:
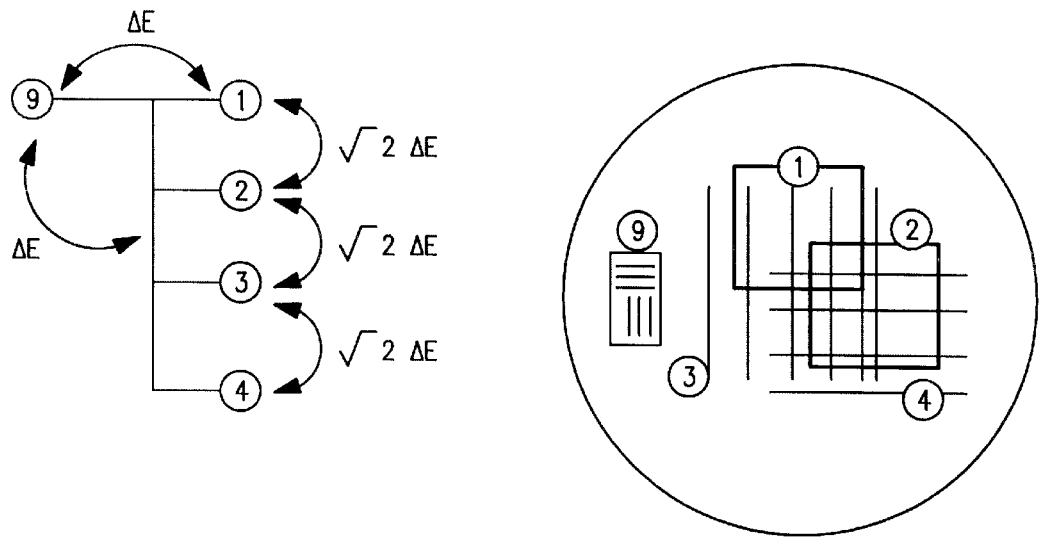
FIGS. 2A and 2B are schematic views illustrating an alignment accuracy by the present invention and a comparison example.
Figure 2B:
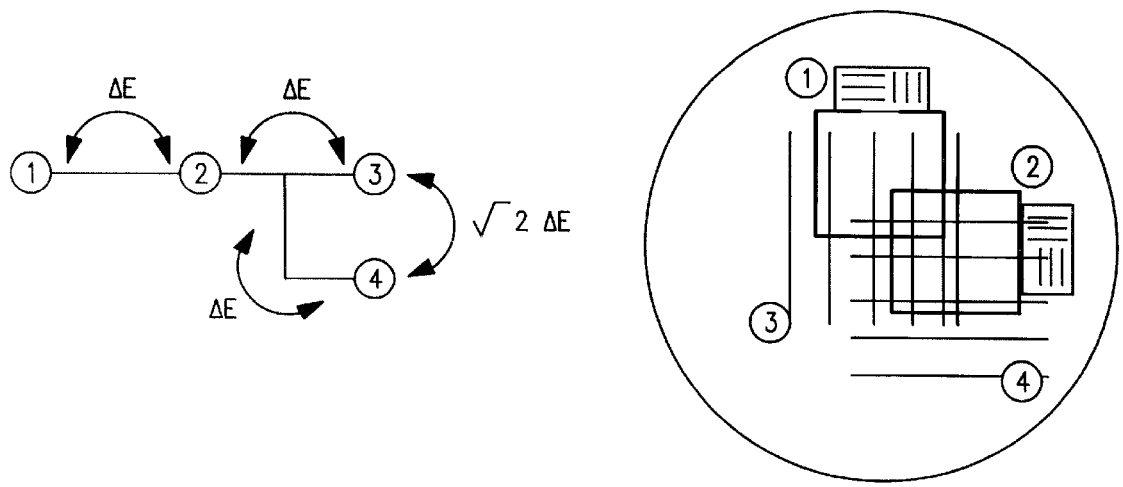

In this embodiment, the pattern exposure is carried out through the multiplex exposure before the development, and the exposure pattern can be precisely positioned relative to the immediately previous or the further previous exposure pattern, so that a highly accurate fine pattern can be formed. FIGS. 2A and 2B show this in comparison with a comparison example. FIG. 2A shows a comparison example wherein a mark provided on the wafer is used as a common reference mark for the exposure steps (1)–(4), and FIG. 2B shows the above-described type (FIG. 6); and at the left side, there is shown an alignment tree showing the relation between the exposure step an and the alignment mark, and the right side schematically shows the exposure pattern and the alignment mark in each step. In the comparison example in FIG. 2A, an alignment mark is formed on the wafer through one method or another beforehand, and the alignments of the respective steps are carried out using this as a reference mark.

However, the alignment accuracy using the same alignment mark is deteriorated as compared with the accuracy of the apparatus itself. The reason will be described.

In a pattern forming method using usual exposure device, the alignment mark is formed with the circuit pattern in a preliminary step, and it is a physical pattern after the development and the etching or the like. In the subsequent exposure, the physical mark is used for the detection and control for the alignment. If the incompleteness of the mark is neglected, the alignment accuracy between two exposure steps in a normal exposure device is dependent only on the error $\delta E$ of the detection and the control. Therefore, the entire alignment error is $E = \delta E$.

When the method is used in which the mark is provided on the wafer beforehand in each of the steps of the multiple exposure, the entire alignment error E' includes the error in the detection and control $\delta E1$ for the mark in the previous exposure step, and the error $\delta E2$ for the same mark for the current exposure. If the errors have no interrelation, $E' = (E1^2 + E2^2)^{1/2}$. When $\delta E = \delta E1 = \delta E2$, then E' is $= 2^{1/2}$, $\delta E2 = 1.41\delta E1 = 1.41\delta E$, so that the alignment error is larger by more than 40% than the positioning accuracy of the apparatus per se.

In the comparison example in FIG. 2A, the reference mark (3) is provided on the wafer, and the mark (3) is used as a reference mark, in the projection exposure steps (1) and (2) and in the two-beam interference exposure steps in (3) and (4) (multiplex exposure). The alignment accuracy is $\delta E$ between the reference mark (3) and the projected pattern in (3)-(1) and (3)-(2), but the alignment accuracy between the actually formed patterns is $2^{1/2}$ $\delta E$ in processes (1)-(2) and (1)-(3). What is to be aligned are the formed patterns, but the accuracy of the alignment is worse than $\delta E$.

In FIG. 2B, according to the present invention, the situation is as follows.

The alignment mark (1) is projected simultaneously with the pattern in the first projection exposure. Using the mark (1) as a reference Mark, the pattern and an alignment mark (2) are projected through the projection exposure of process (2).

Using mark (2) as a reference mark, the pattern is projected by the two-beam interference exposure for process (3).

Using mark (2) as a reference mark, the pattern is projected by the two-beam interference exposure for process (4).

When the multiplex exposure is carried out in this manner, the alignment error between patterns in (1)-(2), (2)-(3) and (2)-(4) is $\delta E$, so that the error is smaller by more than 40% than in the comparison example in FIG. 2A.

Thus, by the use of the method of the present invention, the alignment accuracy is good in the major steps in the exposure method comprising combined projection exposure and two-beam interference exposure.

As will be described hereinafter, in the comparison example in FIG. 2A, the alignment mark which is a reference mark may be formed as a latent image, and the multiplex exposure with a high alignment accuracy is accomplished even when the alignment using the developed alignment mark is not usable for the alignment.

In the exposure operation of this invention, it is often the case that a number of exposure patterns (shots) are repeatedly formed on the wafer in the alignment detection, alignment control and exposure steps. In such a case, a die-by-die (die to die) or a global alignment type as shown in FIGS. 7 and 8 is usable.

Figure 7A:
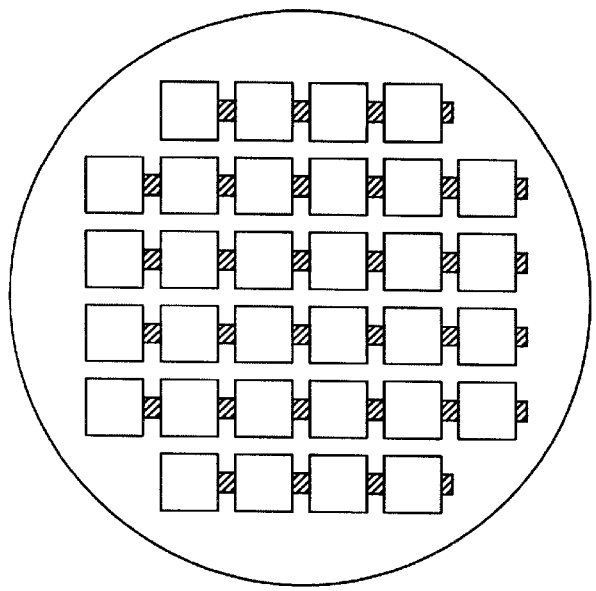
FIGS. 7A and 7B illustrate a die-by-die alignment.
Figure 7B:
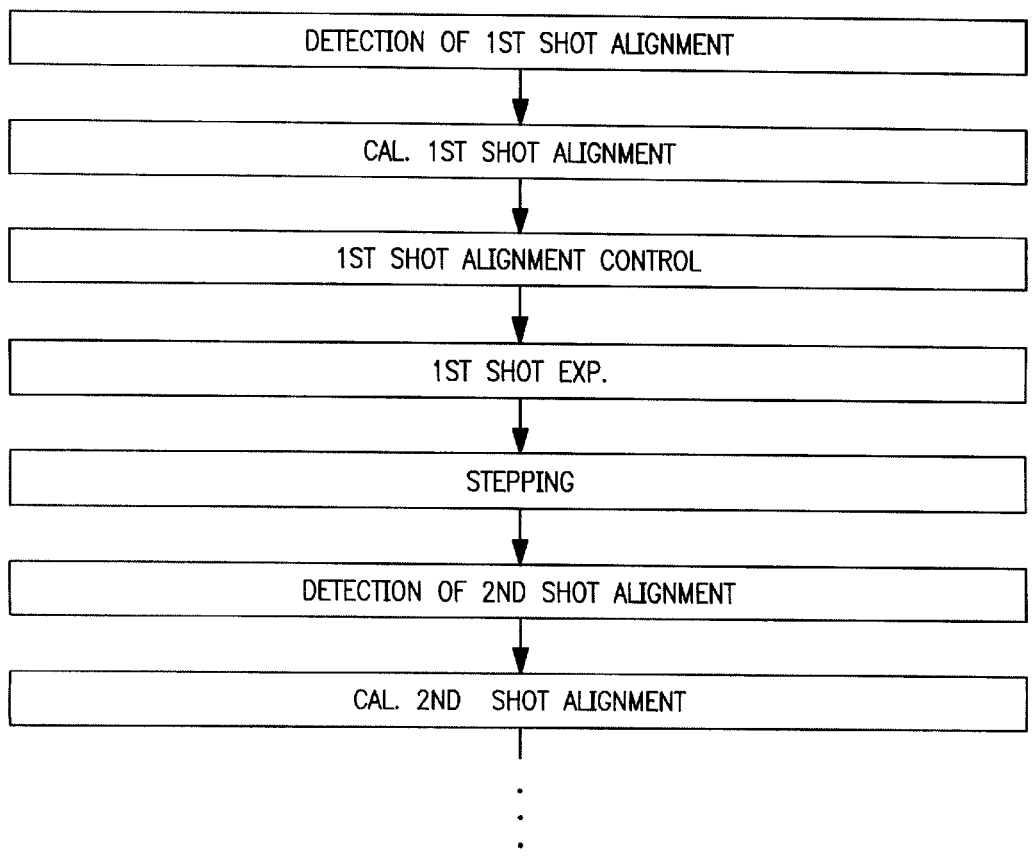

FIGS. 7A and 7B schematically show a die-by-die type. FIG. 7A shows a shot disposition on the wafer, and the hatched portion is the portion where the alignment mark can be formed for the shots. One wafer is exposed to the exposure pattern and the alignment mark formed on the same mask, repeatedly. FIG. 7B shows an operation flow chart of the die-by-die alignment. In the die-by-die type, the alignment detection and the control (calculation) are effected for each of the shots. More particularly, the alignment detection and control is performed for the first shot, and then, the exposure operation is carried out, and then the stage movement is carried out for the next shot, and then, the alignment and the exposure operation is carried out for the second shot, and these are repeated.

Figure 8A:
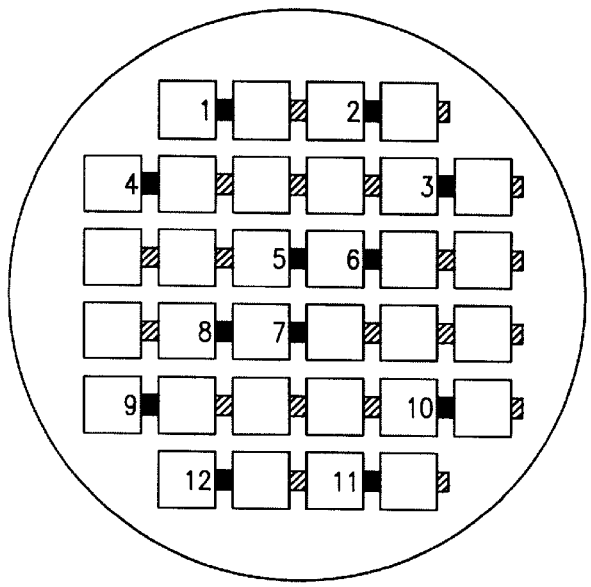
FIGS. 8A and 8B illustrate a global alignment.
Figure 8B:
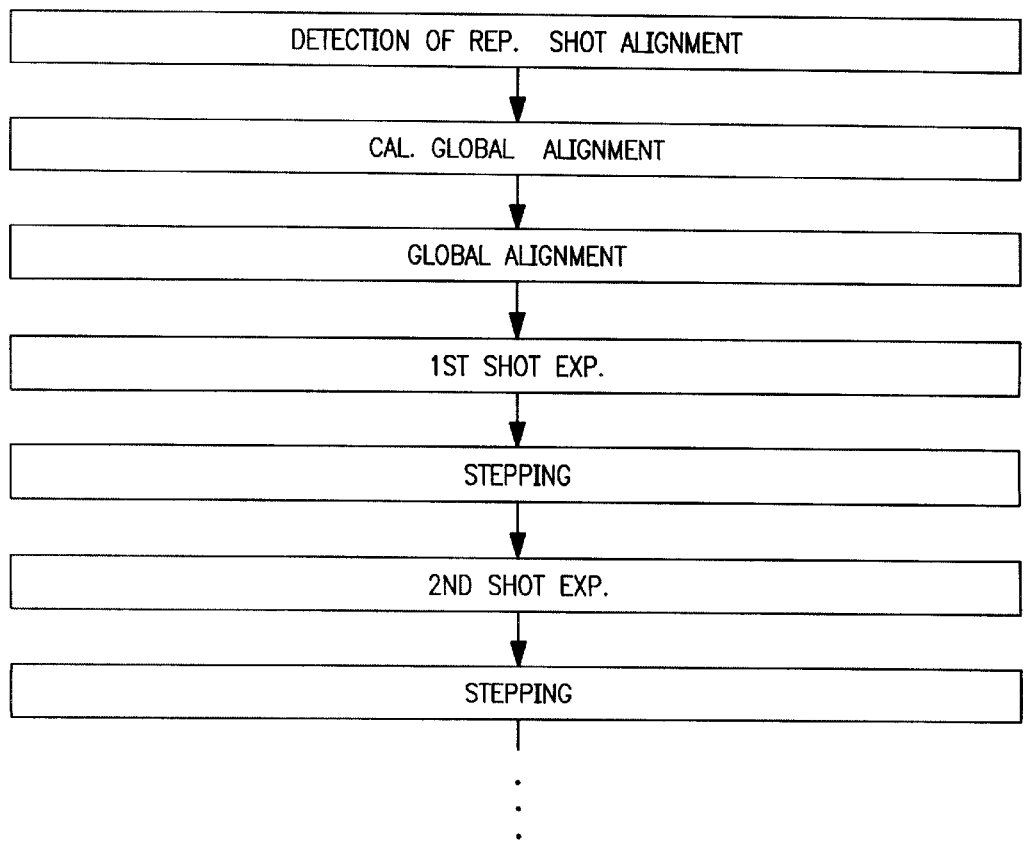

FIGS. 8A and 8B illustrate the global alignment type. The illustration is similar to FIGS. 7A and 7B. Similarly to the die-by-die system, the wafer is exposed to a plurality of patterns. In the global alignment type, the alignment for a plurality of shots is carried out only at one representative position on the water. Prior to the exposures for all shots, the alignment is carried out once. The representative position on the wafer is properly selected by checking a plurality of shot areas and performing calculations.

In the example of FIGS. 8A and 8B, the alignment marks for the shots 1–12 are checked. The calculation may be such that a gravity center is determined on the basis of the average of the data with or without weighting. The wafer is positioned to the representative wafer position, and then the exposure is effected for each of the shots. During the exposure operations, the wafer is moved between the shots.

When a plurality of shots are exposed on one wafer, the above-described methods are usable. In such a Case, the operation step shown in FIG. 6, for example, may be such that of the exposure steps and the latent image detection and alignment control prior thereto, if any, are carried out for all shots on one wafer, and then, the next exposure step and the latent image detection and the alignment control prior thereto are carried out for all the shots on one wafer, and the operation is repeated.

Figure 9:
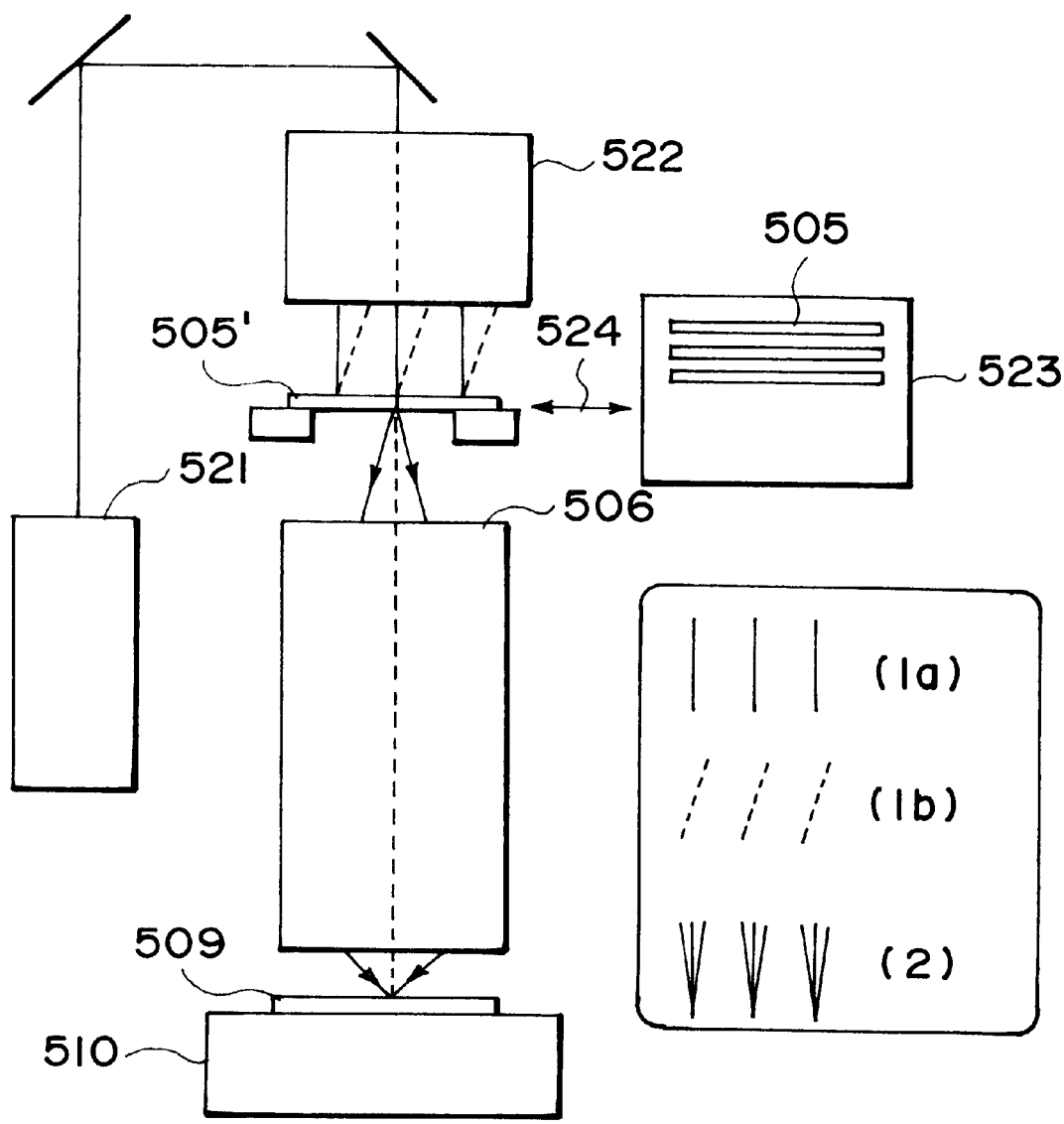
FIG. 9 is a structural schematic view of a second embodiment of an exposure device according to the present invention.
Figure 11:
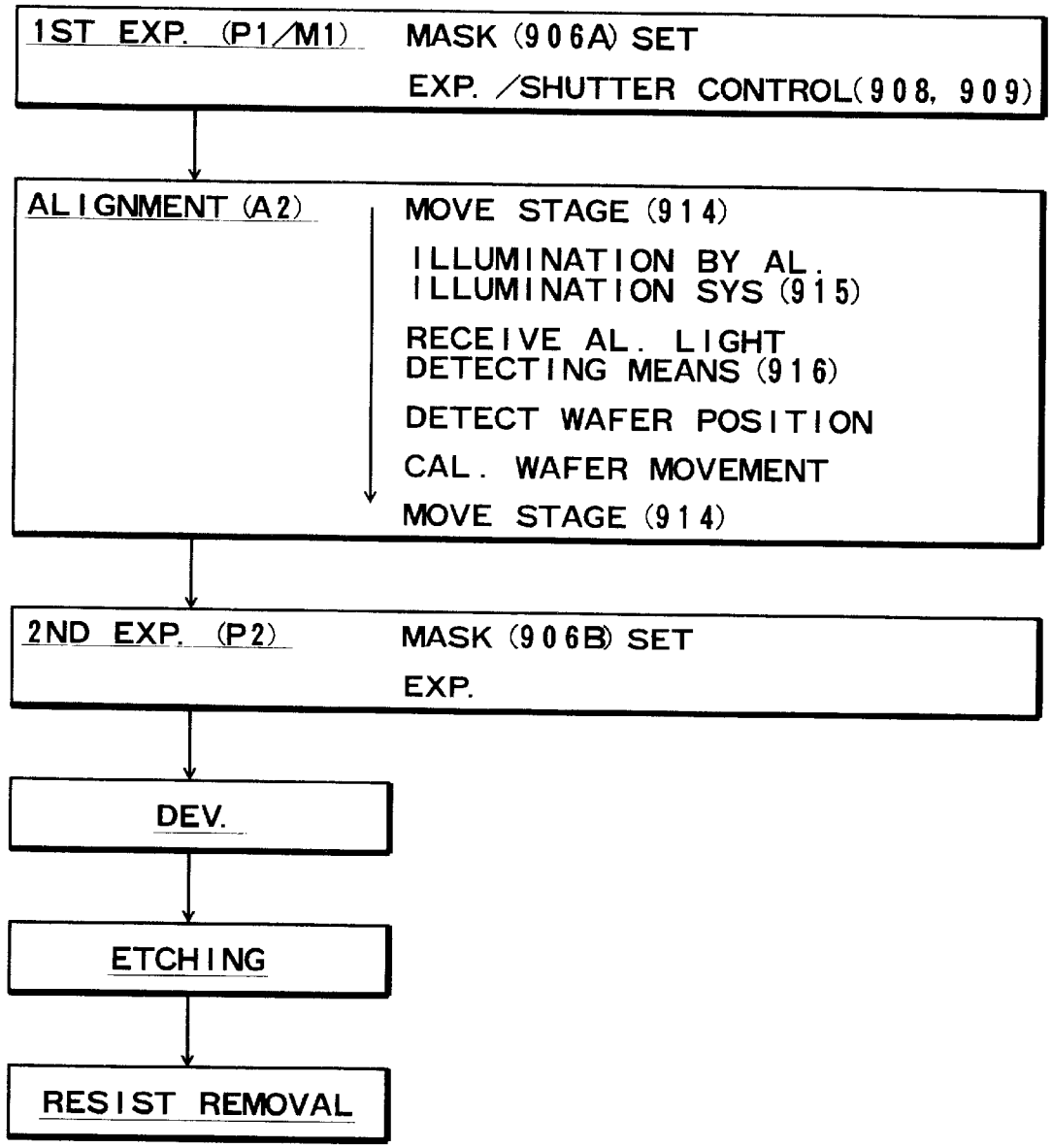
FIG. 11 is a flow chart of an example of an operation step in an apparatus according to a third embodiment.

FIG. 9 is a structural schematic view of an apparatus according to a second embodiment of the present invention. In the Figure, the same reference numerals are assigned to the elements having the corresponding functions. Designated by 521 is a light source for the exposure, such as an excimer laser; 522 is an illumination optical system; 523 is an accommodating portion for the mask 505; 524 is a feeding device for an exchange of the mask. This embodiment is different from the foregoing embodiment in that two-beam interference exposure is carried out at the projection exposure position through the projection optical system.

In the bottom right of FIG. 9, the major beams of the illumination light for the mask illumination by the illumination optical system 522 are shown. During the two-beam interference exposure operation, the illumination optical system 522 forms a parallel illumination light 1a or an inclined incident illumination light 1b from the beam supplied from the light source 521. And, a two-beam interference pattern is formed on the wafer 509 through a projection optical system 506 by way of a Levensen type phase shift mask (in the case of the parallel illumination light), an edge shifter type mask (in the case of parallel illumination) or a mask not having a phase shift (in the case of the inclined illumination). When the projection exposure is carried out using the mass 505 having the pattern, the mask is exchanged by the feeding device 524, and the illumination optical system 522 switches the illumination system to the normal illumination light 2. For the switching, the opening aperture stop disposed immediately after the fly eye lens in the illumination optical system is switched to the one having a sufficiently small opening diameter, or another switching, exchange or insertion of a predetermined optical element in the illumination optical system. Although not shown, an alignment detecting apparatus using a latent image is provided, which is similar to the case of FIG. 5.

The same is applicable to an exposure apparatus commonly using the two-beam interference exposure portion and the projection exposure portion shown in FIG. 9 (first embodiment). In this embodiment, there is no need of large scale motion of the wafer stage 510 between the beam interference exposure and the projection exposure.

A third embodiment of the present invention will be described.

FIGS. 10(A) to 10(C) are structural schematic views of an exposure device according to a second embodiment of the present invention. FIG. 10(A) shows a whole system; FIG. 10(B) shows a mask; FIG. 10(C) shows a masking blade portion. In the Figures, the illumination extending from the laser beam source to the optical integrator 901 is omitted for simplicity. Designated by 901 is an optical integrator; 902 is an illumination aperture stop; 903 is a capacitor lens; 904 is a masking blade; 905 is a masking imaging lens; 906 is a mask; 907 is a mask stage; 908 is a pattern exposure portion shutter; 909 is a shutter controller; 910 is a mask exchanging apparatus; 911 is an exchanging mask; 912 is a projection optical system; 913 is a wafer; 914 is a wafer stage; 915 is an illumination system for latent image alignment; 916 is a latent image alignment light detecting means. Designated by 906A is a mask for the first exposure, and 905B is a mask for the second exposure in this embodiment.

Using such an apparatus, the exposure operation is carried out with the control of the flow chart shown in FIG. 1. First, a wafer coated with a resist is set on the stage 914, and a mask 906A for the first exposure is set on a mask stage 907 among the masks 911 using a mask exchanging apparatus 910.

In the first exposure, the first pattern and the alignment mark (M1) on the mask 906A are projected simultaneously onto the wafer. In the exposure, the image of the mask 906 is projected onto the wafer 913 through the projection optical system 912.

The (integrated) exposure amount of the pattern portion and the mark portion are controlled so as to be different from each other. For the control, a shutter 908 is provided in the pattern portion of the masking blade 904, and the opening and closing thereof is controlled by a shutter controller 909 to control the exposure time of the pattern portion. The exposure time will be described in detail hereinafter.

After the first exposure, a latent image of an alignment mark M1 provided by the first exposure (P1/M1) is formed on the wafer 913. Using the latent image, the alignment (A2) for the second exposure is carried out. In the exposure device of this embodiment, the alignment apparatus is an off-axis type similarly to the projection exposure in the first embodiment, and therefore, the wafer 913 is first moved to the predetermined measuring position of the. alignment apparatus 915, 916 along the water stage 914. Then, the latent image of the alignment mark M1 is illuminated by the illumination means 915 for the alignment, the resulting diffracted light is detected by the alignment light detecting means 916, so that correct position of the wafer is determined. On the basis of the position information, the optimum wafer position for the second exposure is calculated by a predetermined calculation, and the wafer stage 914 is moved by an unshown wafer position control means to the optimum wafer position, so that wafer 913 is placed at the predetermined exposure position.

The alignment mark in the form of a latent image is detected in the same manner as in the first embodiment. Similarly to the first embodiment, although not shown, use may be made with an off-axis microscope for alignment between the wafer and a stage reference or the mask or the like, or a left side alignment system or a right side alignment system.

The second exposure is carried out for the exposure thus aligned. First, the mask 906B for the second exposure is set on the mask stage 907. Then, he mask pattern (P2) is projected onto the wafer 913 through the projection optical system 912. In this embodiment, the multiplex exposure is a duplex exposure for the simplicity of explanation, and therefore, the second exposure Is the final exposure. So, there is no need-of formation of the latent image in the second exposure. When the multiplex exposure is an n-folded exposure (n is an integer greater than 1), the latent image mark is not formed in the n-th exposure. When the foregoing exposure operation is completed, the exposure pattern P1, P2 are formed superimposedly through the first exposure (P1/M1) and the second exposure. The wafer is developed by which the pattern is formed. The developing operation may include the PEB processing or the like. After the development, the etching and the resist removal are carried out so that a physical pattern is formed on the wafer.

The control of the exposure time will be described. In this embodiment, the alignment mark exposure is carried out simultaneously with the pattern exposure, and the exposure amount is controlled for the areas.

Figure 12:
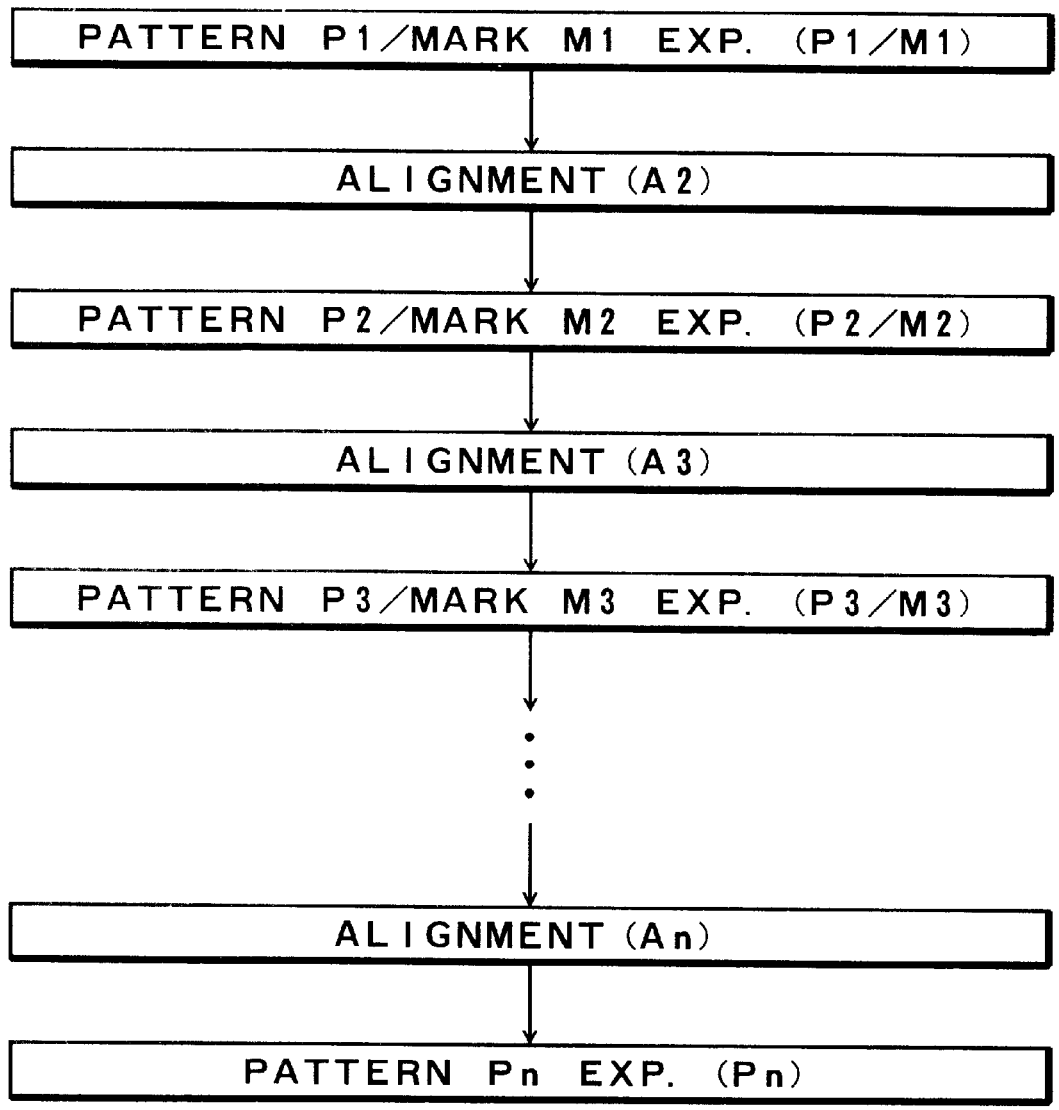
FIG. 12 is a flow chart relating to exposure and alignment in an apparatus according to a third embodiment.

Referring to FIG. 12 (flow chart), a process of the exposure and the aligning operations will be described. In this flow chart, n-folded exposure is used. The mask of the m-th exposure (0<m<n, m: integer) is provided With a pattern Pm for the multiplex exposure and an alignment mark Mm for the (m+1)-the exposure, and the mask for the n-th exposure is provided with a pattern Pn for the multiplex exposure.

In this embodiment, the pattern projection exposure and the mark projection exposure are simultaneously carried out. As in FIG. 12, the wafer coated with the resist is exposed to the pattern P1 of the mask for the first exposure pattern and to a mark M1 simultaneously projected (P1/M1). Then, the position of the latent image of the mark M1 on the. wafer is detected in (A2), and the positioning for the next projection exposure (P2/M2) is executed.

Then, the projection exposure (P2/M2) for the pattern P2 and the mark M2 are carried out, and similarly, the alignment using the latent image or the mare M2 is for the projection exposure(P3/M3) of the pattern P3 and the mark M3, and they are repeated for the multiplex exposure. In the case of n-folded exposure, the alignment ends in the pattern exposure n(Pn) operation, and at the last exposure (Pn), there is no need of exposure of the wafer with the mark, so that only the pattern is projected.

The alignment accuracy in the series of operations is as follows. In the alignment between the first latent image of the Lark M1 and the second exposure pattern P2, the positioning is effected using the (A2), and the error is assumed to be δE. The δE is dependent on the alignment detection accuracy, the control accuracy of the positioning using the stage or the like.

Then, the alignment between the mark M2 projected simultaneously with the pattern P2 and the next exposure pattern P3 uses (A3) for the positioning. The error is δE, too. Similarly, the alignment for the pattern exposure is carried out using the latent image of the mark provided in the immediately previous patter exposure with the error of δE.

Figure 13:
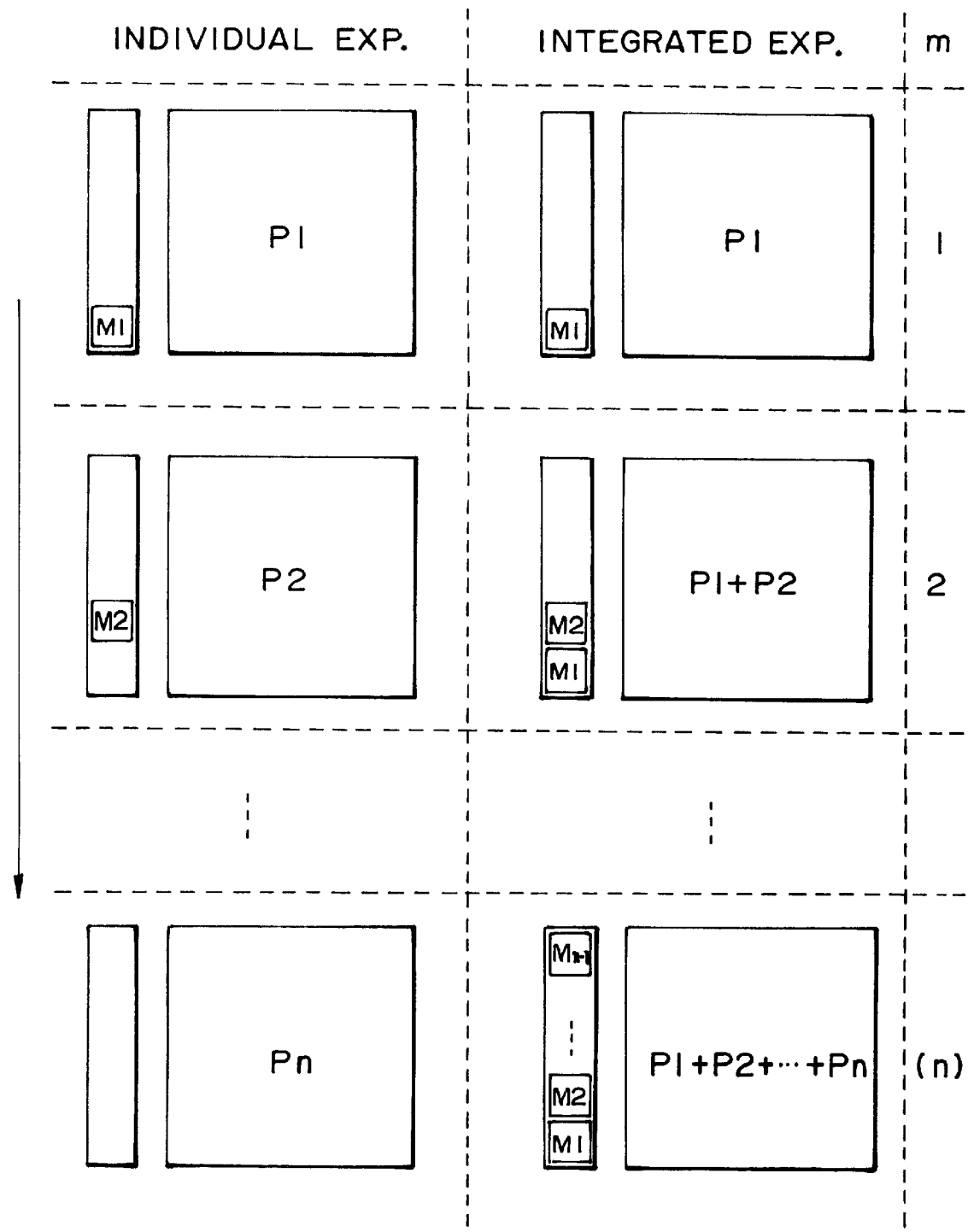
FIG. 13 is a schematic view showing exposure of the exposure region.

FIG. 13 is a schematic view for each step, showing the exposure of the exposure region in this method. The left side shows the disposition of the pattern projected by each projection, and the right-hand side shows the latent image forming position on the water as a result of the exposure. In this embodiment, the latent image formation region is divided into n areas on the wafer, and marks M1 to Mn are projected to the predetermined positions in the exposure steps.

The control of the exposure amount will be described.

As will be understood from FIG. 13, in the multiplex exposure of this embodiment, each of the alignment mark is provided by a simplex exposure, but the pattern is provided by n-folded multiplex exposure.

When n-folded exposure is used, the integrated exposure amount through the n-folded exposure, that is, E(P1)+E (P2)+E(P3) . . . ++E(Pn) (exposure amount in the m-th exposure is E(Pm)) is about the threshold of the exposure amount of the resist. Therefore, an exposure amount per one exposure is about 1/n of the normal pattern exposure through the projection exposure. However, for the marks M1, M2 . . . Mn, the 1/n exposure amount is too small to provide sufficient contrast of the resist to detect the latent image. Therefore, in order to improve the detection accuracy, the mark exposure portion is exposed with an exposure amount which is greater than the exposure amount of the pattern exposure portion. In this embodiment, the exposure amount control for the respective areas, are effected as follows. As a result, the latent image of the mark Mm is provided at a sharp contrast so that good detection thereof is accomplished.

A pattern exposure portion shutter for controlling the exposure amount of the pattern exposure portion is provided at a mask surface or a plane which is optically conjugate with the mask surface (a masking blade 904 plane in the illumination optical system in FIG. 10(A), so that the exposure time for the pattern exposure Portion can be controlled independently of the mark exposure portion, so that a desired exposure amount can be provided for the respective areas.

Figure 14A:
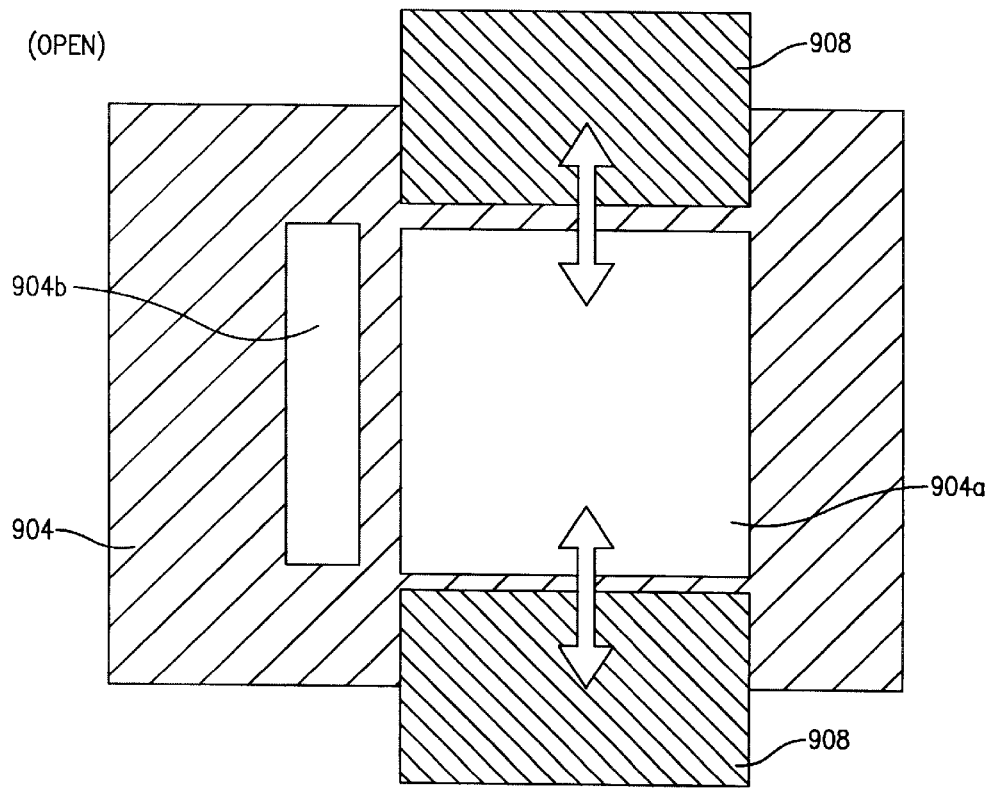
FIGS. 14A and 14B are illustrations of operations of a pattern exposure portion shutter.
Figure 14B:
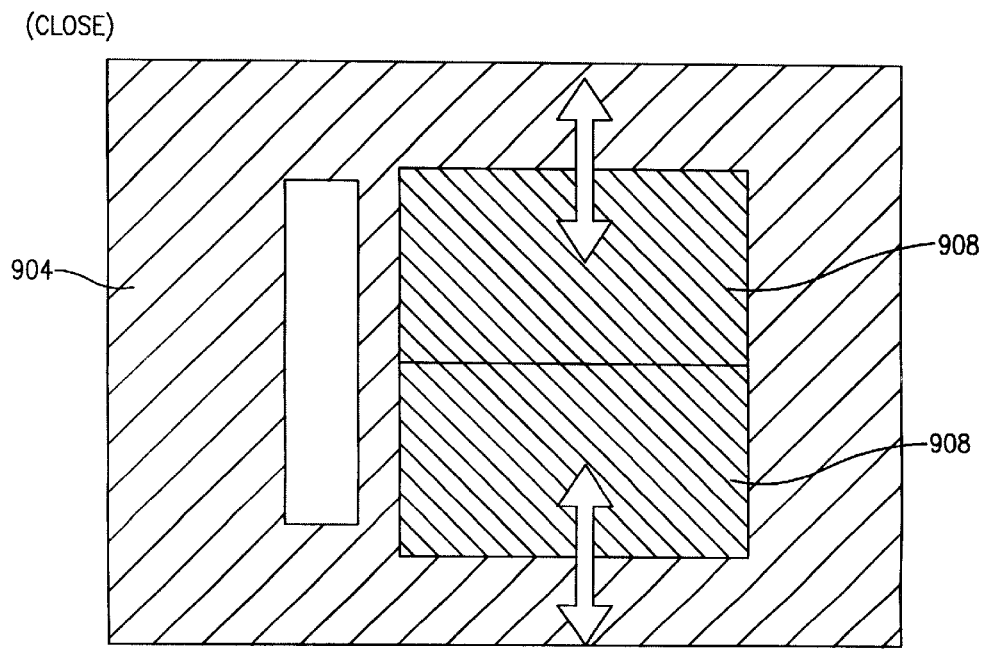

FIGS. 14A and 14B show the operation of the pattern exposure portion shutter 908 on the masking blade 904 plane shown in FIGS. 10(A) to 10(C). FIG. 14A represents the situation when the shutter is open, and FIG. 14B shows the situation when the shutter is closed. In this apparatus, the pattern exposure portion shutter 908 is disposed such that pattern exposure portion 904*a* is covered when the shutter is closed, and the exposure time is controlled by the opening and closing operation thereof.

Figure 15A:
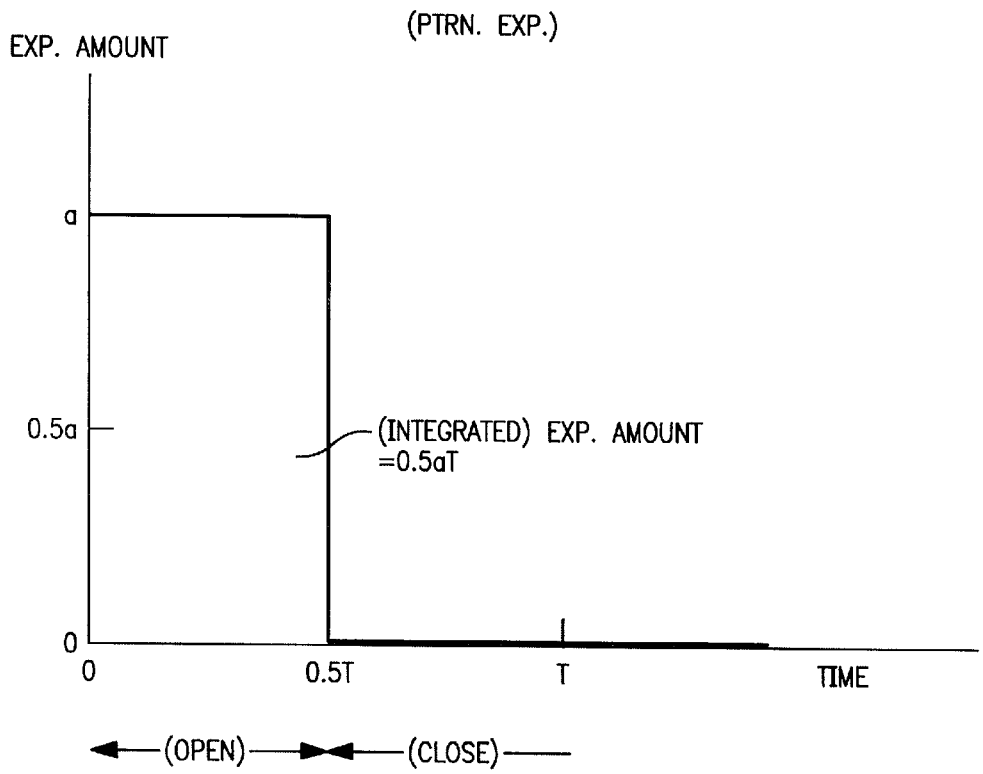
FIGS. 15A and 15B are illustrations of an exposure amount and an exposure time.
Figure 15B:
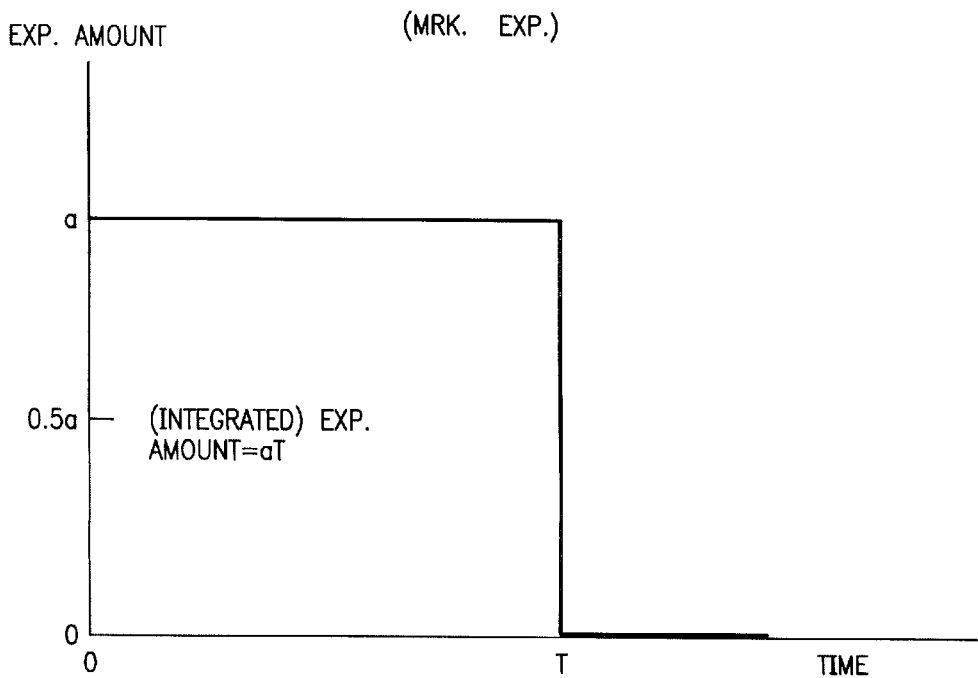

FIGS. 15A and 15B show an exposure amount and an exposure time when the pattern exposure portion and the mark exposure portion are carried out using the pattern exposure portion shutter, for the duplex exposure (n=2). FIG. 15A shows the pattern exposure portion, and FIG. 15B shows the corresponding change of the exposure amount with time per unit area. Here, the threshold of the exposure amount per unit area of the resist is about aT.

For the pattern exposure portion, the pattern exposure portion shutter is open from time 0 to 0.5T to permit the exposure, and then, the pattern exposure portion shutter 908 is closed. For the mark exposure portion, the exposure is effected from time 0 to T. This is controlled by an unshown whole shutter. With such operation, the integrated exposure amount during the exposure time T is aT in the mark exposure portion, whereas that in the pattern exposure portion is 0.5aT. When the double exposure is carried out with the structure shown in FIG. 13, the exposure amounts of the double exposure portion and the alignment mark are both substantially aT, and therefore, the exposure amount of the mark portion is not small as compared with the pattern portion, by which good detection is accomplished.

In the case of n-folded exposure, the exposure time of the pattern exposure portion is 1/n for the alignment mark exposure time.

In this embodiment, the shutter is used only for the pattern exposure portion, but an independent shutter may be used for the mark exposure portion to effect the exposure time adjustment therefor.

In this apparatus, the exposure amount control is carried out by the exposure time. This can be modified as follows:

In the following modified example, transmission factor control filters for the mark exposure portion and the pattern exposure portion are provided in a mask surface or a plane which is optically conjugate with the mask surface (the plane of the masking blade 904 in the illumination optical system in FIG. 10(A)) to adjust the transmission factors for the areas so as to control the exposure amounts.

Figure 16:
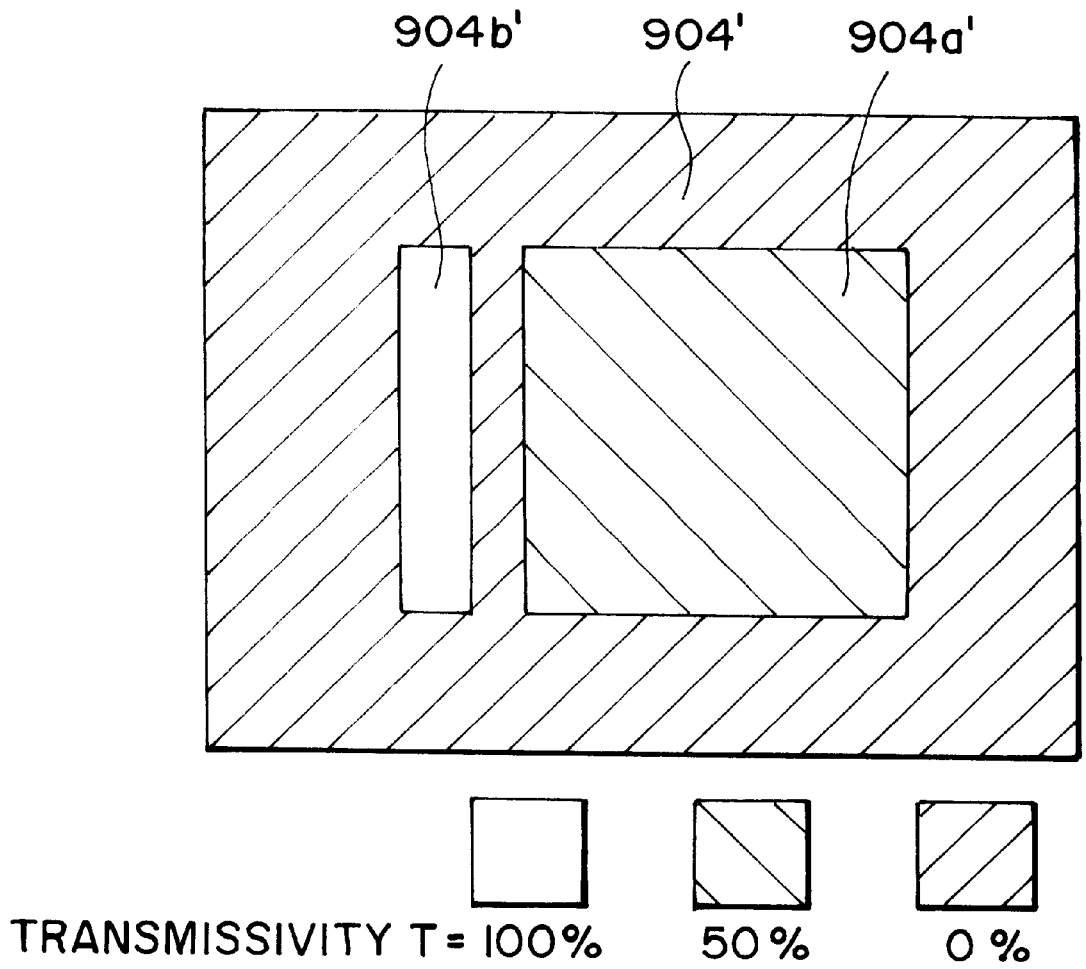
FIG. 16 is an illustration of a transmission factor control filter in a modified example of the third embodiment.

FIG. 16 shows an example, wherein the masking blade filter 904' and a transmission factor control filter are provided, the case of n=2. The masking blade filter 904' is inserted in place of the masking blade 904 (and the shutter 908) in FIG. 10(A). In the pattern exposure portion 904a', a 50% filter is disposed, and the mark exposure portion 904b' has a substantially 100% opening, by which the exposure amount ratio is adjusted to be 1:2.

Figure 17A:
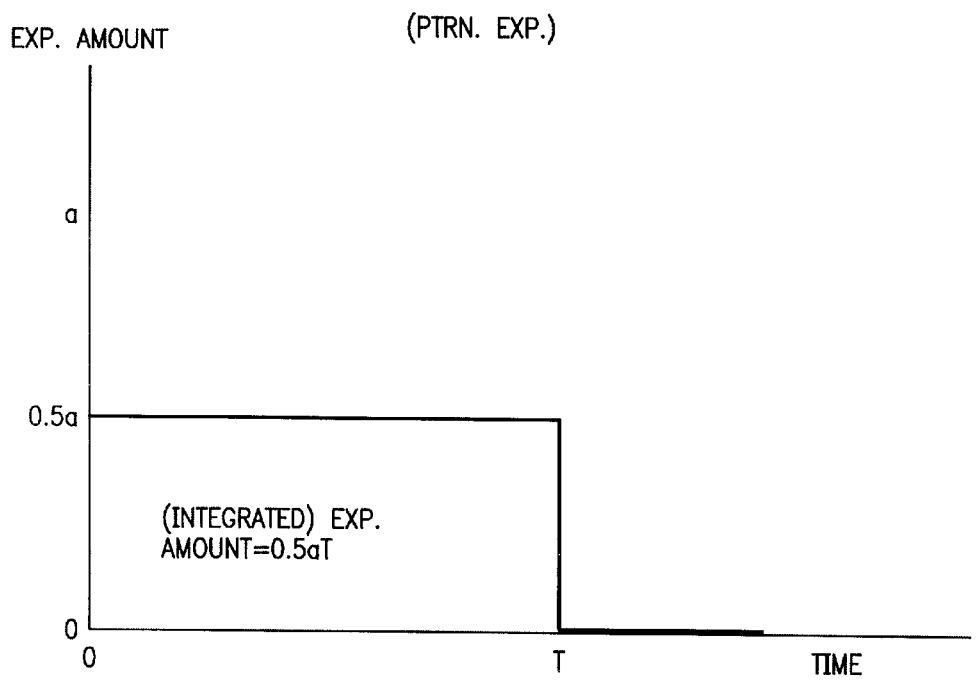
FIGS. 17A and 17B are illustrations of an exposure amount and an exposure time.
Figure 17B:
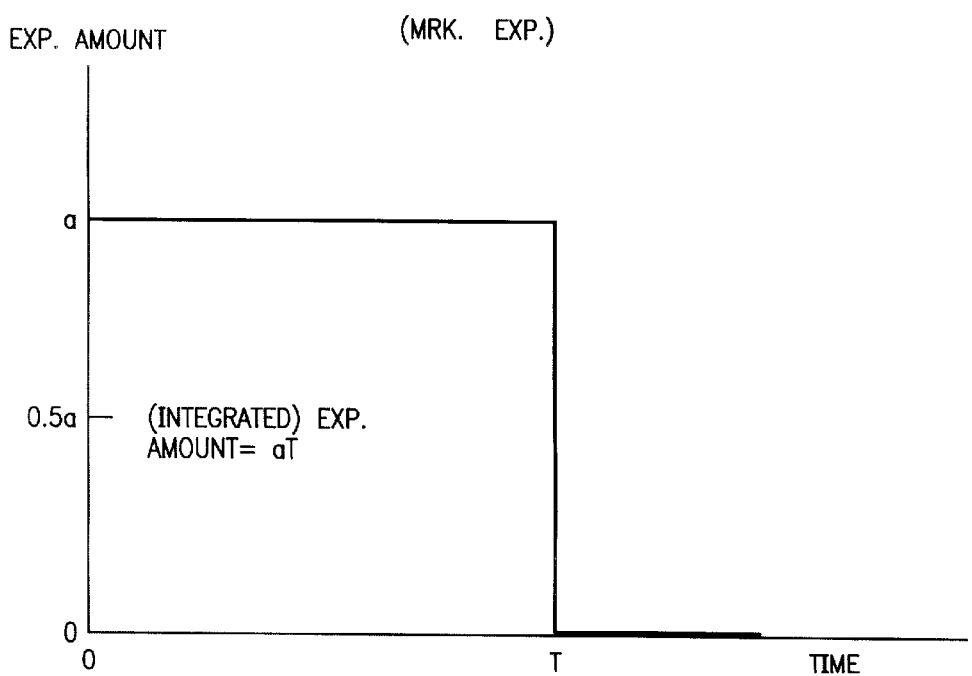

FIGS. 17A and 17B show the exposure amount and the exposure time when the exposure operation is carried out for the pattern exposure portion and the mark exposure portion using such a masking blade filter 904'. The top portion of the Figure shows the pattern exposure portion, and the bottom shows the corresponding change of the exposure amount with time per unit area. By the transmission factor control filter having a transmissivity of 50%, the exposure amount reduces from a to 0.5a in the pattern exposure portion, and the integrated exposure amount during the exposure time T controlled by the whole shutter is 0.5aT which is one half the exposure amount aT in the mark exposure portion.

When this is used with the structure of FIG. 13 (double exposure), the exposure amounts of the mark portion and the pattern portion are both substantially approx. aT, so that the exposure amount of the mark portion is not smaller than that of the pattern portion, and therefore, better alignment detection is accomplished.

In the case of the n-folded exposure, the transmission factor of the pattern exposure portion is 1/n of the mark exposure portion transmission factor.

In this modified example, a filter may not be used, and in place thereof, the illumination system may be designed so that illuminance on the mask surface is distributed in a desired manner.

In these modified embodiments, the integrated exposure amount of the mark portion is made substantially the same as that of the pattern portion after the multiplex exposure, but the exposure amount in the mark portion may be further increased so that contrast of the latent image is amplified. In this case, the exposure time of the mark exposure portion may be increased in FIGS. 15A and 15B, for example. The foregoing embodiment may be combined with the modified example, so that an ND filter is selectively inserted, the exposure time is also controlled, and a filter element of a liquid crystal or the like having a dynamically changeable transmission factor distribution is utilized.

In this embodiment, the transmission factor control is carried out by the shutter or the like on the masking blade plane, but the position is not limited to this, and a position optically substantially conjugate with the mask or wafer plane may be used.

In this embodiment, the shutter and/or the filter are disposed, but the similar shutter or filter may be disposed at the mark exposure portion to adjust the exposure time or the transmission factor.

A fourth embodiment of the present invention will be described.

In this embodiment, the alignment mark exposure is carried out before the pattern exposure, and the exposure amount control is carried out independently.

In the foregoing embodiments, by using the latent image of the alignment mark formed simultaneously with the pattern, the alignment accuracy in each exposure is decreased from $(2)^{(1/2)}\delta E$ to $\delta E$. In this embodiment, $\delta E$ is reduced by which the alignment accuracy in each exposure is improved. When the bare wafer is exposed or when the development alignment mark is not usable, as described in the foregoing, $\delta E$ increases by the multiplex exposure without the use of the alignment mark. In this embodiment, the latent Image mark is formed beforehand, and the alignment before the exposure is carried out using the latent image mark as a reference, by which the multiplex exposure is accomplished with a small $\delta E$ (high alignment accuracy) irrespective of the state of the wafer.

This embodiment may use the apparatus shown in FIG. 10(A) for example. Therefore, a detailed description of the structure is omitted.

Figure 18:
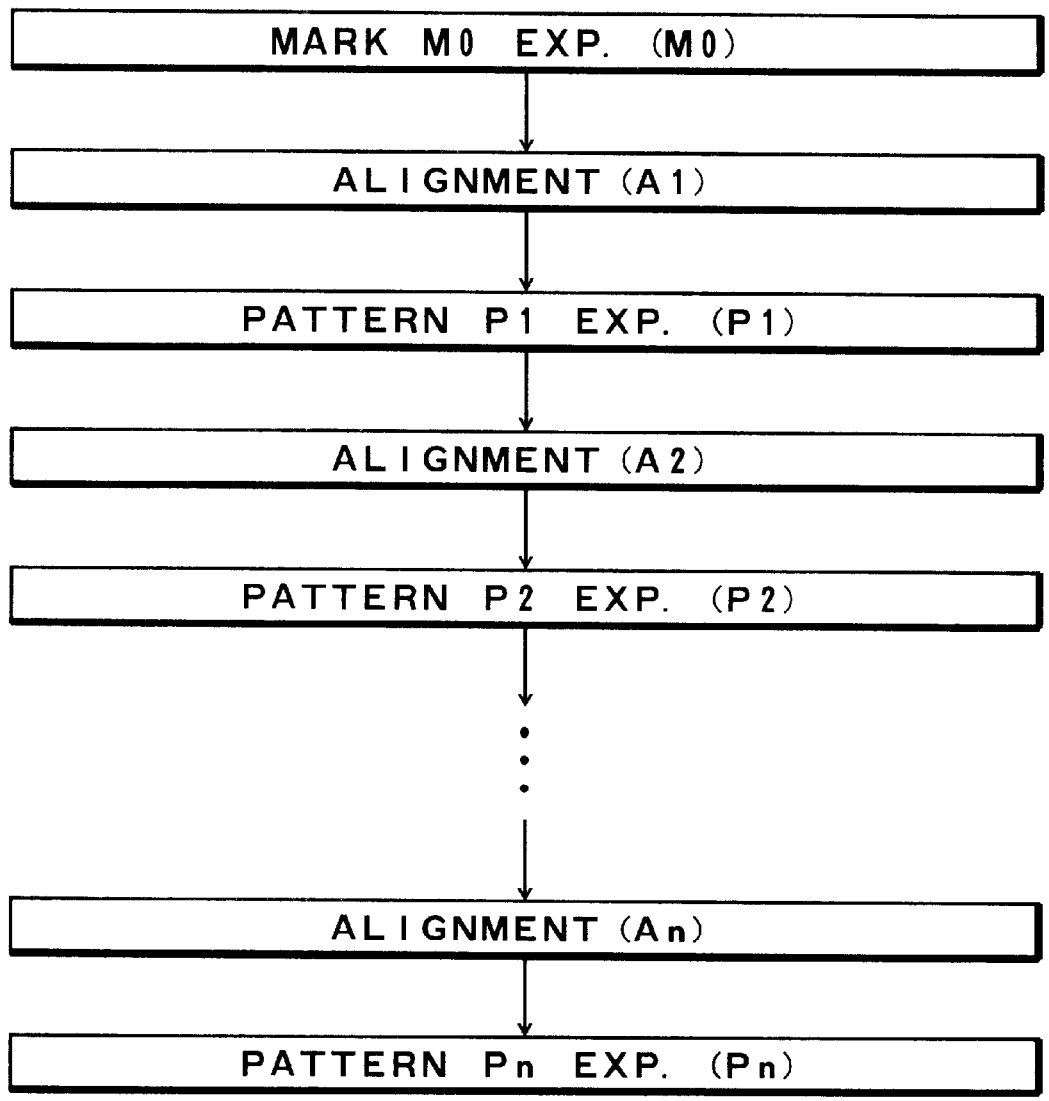
FIG. 18 is a flow chart relating to exposure and alignment in an apparatus according to a third embodiment.

Referring to FIG. 18 (similar to FIG. 12), exposure and aligning operations will be described.

In this embodiment, the mark exposure, the pattern exposure and the alignment are carried out in accordance with the flow chart of FIG. 18. First, the wafer coated with a resist is exposed to an alignment mark M0. In this case, in FIG. 10(A) for example, a mask having an alignment mark is used, and the wafer is exposed to the alignment mark only, while the shutter 908 is completely closed.

Then, the relative position between the exposure device and the wafer is detected using the latent image of the mark M0, and alignment (A1) is carried out to correctly position the exposure pattern P1. The position detection method using the latent image may be the same as in the foregoing embodiments.

With the alignment (A1) state, the exposure pattern P1 is projected with the exposure amount which will be described hereinafter. Here, the mask has a pattern only, and the alignment mark is not projected.

Thereafter, aligning operation (A2) and the exposure to the exposure pattern P2 are carried out, and the projection exposure for the exposure pattern Pn is repeated to effect the n-folded exposure.

Figure 19:
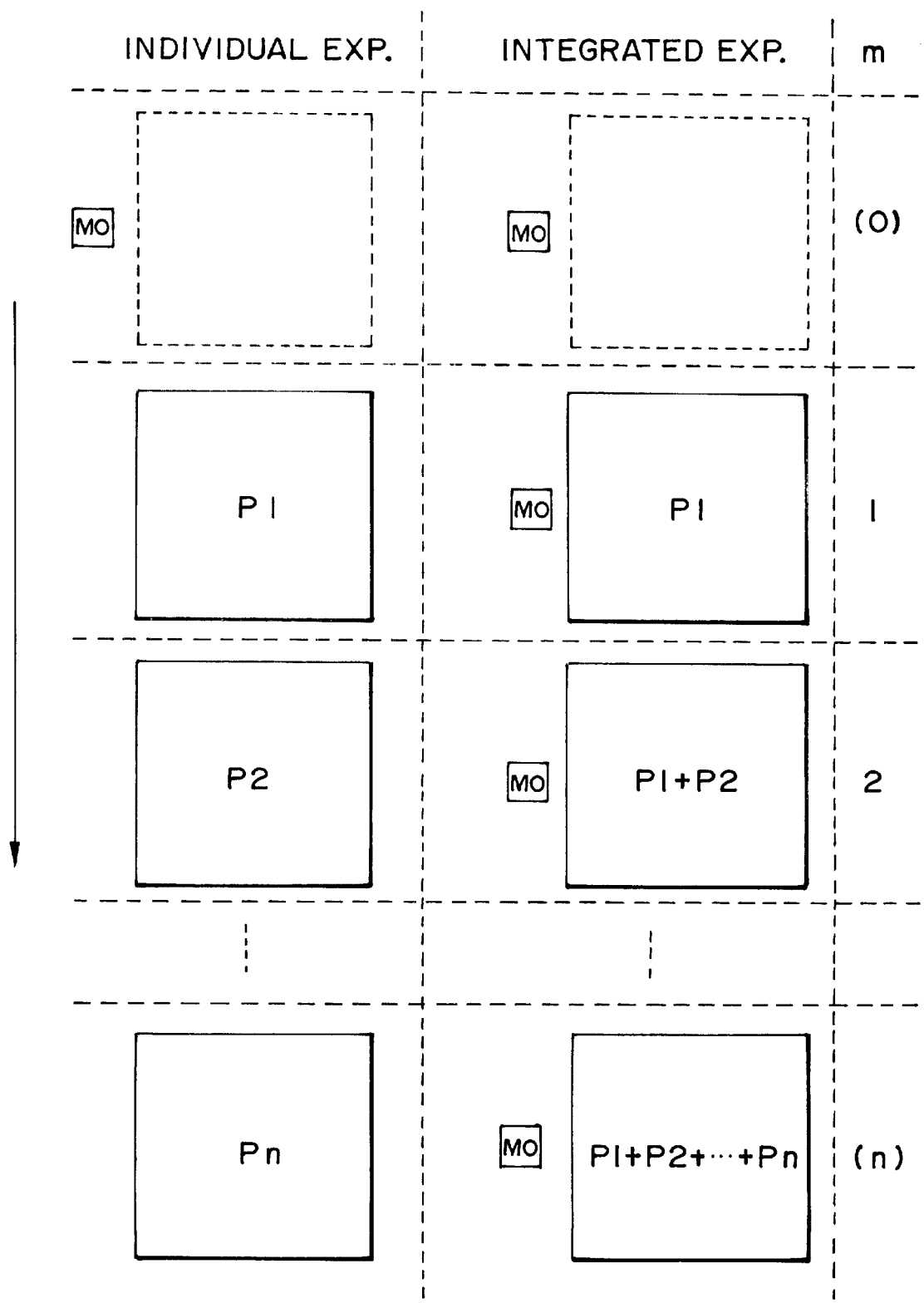
FIG. 19 is a schematic view showing exposure of the exposure region.

FIG. 19 shows the exposure in the exposure region in this embodiment in the similar manner as with FIG. 13.

As will be understood from FIG. 19, the alignment mark it simplex exposure, whereas the pattern exposure is n-folded.

When n-folded exposure is used, the integrated exposure amount through the n-folded exposures that is, $E(P1)+E(P2)+E(P3) \ldots + E(Pn)$ (exposure amount in the m-th exposure is $Z(Pm)$), is about the threshold of the exposure amount of the resist. Therefore, exposure amount per one exposure is about 1/n of the normal pattern exposure through the projection exposure.

However, as regards the mark M0, the detection of the latent image is as will be described hereinafter, and therefore, the contrast provided by the latent image is small if the exposure amount is the same as that of pattern exposure (1/n).

Therefore, in order to improve the detection accuracy, the exposure amount of the mark M0 is made larger than the exposure amount of the pattern exposure. In this embodiment, the exposure time only for the mark. M0 is controlled to be longer, so that an integrated exposure amount of the mark M0 is larger than or equivalent to the integrated exposure amount after the multiplex exposure for the pattern portion. As a result, the latent image of the mark M0 on the resist has a sharp contrast, thus accomplishing good detection.

In the third and fourth embodiments, too, one wafer frequently is subjected to a number of exposures of the pattern (shot), repeatedly. In such a case, the prior alignment and the step such as the alignment (A2) and the second exposure (P2), are not two separated steps as shown in FIGS. 12, 18, and the combined step including the die-by-die (die-by-die) or global alignment type may be used. In this case, the same method as described with the foregoing embodiments can be used. For example, a met of latent image detection, alignment control and the m-th exposure step is carried out for all the shots, and the next set is carried out for all the shots. For example, the sequence of the operation may be changed.

For example, the exposure method may be either one of two-beam interference exposure and the projection exposure, or the multiplex exposure is carried out by moving the exposure devices. The exposure is not limited to the light exposure.

As an alternative, the alignment using the latent image detection may be carried out in some of the plurality of exposures, and in the remaining exposure steps, another alignment detection method, for example, that using the alignment mark manufactured beforehand. With such an alignment, a high accuracy alignment not influenced by the state of the wafer is accomplished corresponding to the latent image detection. By the alignment using the detection of the latent image mark formed with the previous exposure pattern, the formation accuracy of the pattern is improved corresponding to the executed steps.

Thus, by the use of the exposure device and the mask, the exposure formation of the fine pattern can be accomplished at all times with high precision irrespective of the state of the wafer.

When the use is made for the alignment with the latent image of the alignment mark formed with the previous pattern exposure, further improvement in the accuracy is accomplished.

By the use of the device manufacturing method according to the present invention, devices can be manufactured with high density and with high precision.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   exposure means for effecting a multiplex pattern exposure of a photosensitive substrate before development, the multiplex pattern exposure including a plurality of pattern exposures; and
   alignment means for effecting alignment between the photosensitive substrate and said exposure means using a latent image of an alignment mark formed on the photosensitive substrate, the alignment between the photosensitive substrate and said exposure means being effected before at least one of the plurality of pattern exposures of the multiplex pattern exposure, and the latent image of the alignment mark being formed on the photosensitive substrate simultaneously with a preceding one of the plurality of pattern exposures of the multiplex pattern exposure.

2. An apparatus according to claim 1, wherein the latent image of the alignment mark has been formed with an exposure amount which is larger than that of one pattern exposure of the multiplex pattern exposure.

3. An apparatus according to claim 2, wherein said exposure means includes a shutter for controlling an exposure time of the pattern exposure during formation of the latent image of the alignment mark.

4. An apparatus according to claim 2, wherein said exposure means includes a filter for transmission factor adjustment for controlling an exposure amount of the pattern exposure during formation of the latent image of the alignment mark.

5. An apparatus according to claim 1, wherein the pattern exposures of the multiplex pattern exposure are effected sequentially on a plurality of areas of the photosensitive substrate.

6. An exposure apparatus comprising:
   an exposure system for effecting a multiplex pattern exposure of a photosensitive substrate before development, the multiplex pattern exposure including a plurality of pattern exposures;
   a detection system for detecting a latent image of an alignment mark formed on the photosensitive substrate; and
   an alignment system for effecting alignment between the photosensitive substrate and said exposure system using a latent image of an alignment mark detected by said detection system, the alignment between the photosensitive substrate and said exposure system being effected before at least one of the plurality of pattern exposures of the multiplex pattern exposure, and the latent image of the alignment mark being formed on the photosensitive substrate simultaneously with a preceding one of the plurality of pattern exposures of the multiplex pattern exposure.

7. An apparatus according to claim 6, further comprising an exposure amount adjusting means for effecting exposure of the alignment mark with an exposure amount which is larger than that for the pattern exposure.

8. An exposure apparatus comprising:
   exposure means for effecting a multiplex pattern exposure of a photosensitive substrate before development, the multiplex pattern exposure including a plurality of pattern exposures; and
   alignment means for effecting alignment between the photosensitive substrate and said exposure means using a latent image of an alignment mark formed on the photosensitive substrate in a previous one of the plurality of pattern exposures of the multiplex pattern exposure, the alignment between the photosensitive substrate and said exposure means being effected before at least one of the plurality of pattern exposures of the multiplex pattern exposure, wherein the latent image of the alignment mark is formed on the photosensitive substrate simultaneously with the previous one of the plurality of pattern exposures of the multiplex pattern exposure.

9. An apparatus according to claim 8, wherein said exposure means includes at least one of a two-beam interference exposure means for forming a pattern image using a light interference of two exposure lights and a projection exposure means for projection exposure of a pattern of a mask.

10. An apparatus according to claim 9, wherein said alignment means effects the alignment between the photosensitive substrate and said exposure apparatus using the latent image formed by projection exposure of said projection exposure means, when the pattern exposure is effected by said two-beam interference exposure means.

11. An apparatus according to claim 9, wherein said two-beam interference exposure means and said projection exposure means project the pattern on the photosensitive substrate at a common position.

12. An apparatus according to claim 9, wherein said alignment means, when the pattern exposure is effected by said two-beam interference exposure means, detects the alignment mark on the photosensitive substrate by optical detecting means, and an optical axis of at least one of an illumination optical system of the optical detecting means and a receiving optical system crosses with a pattern exposure position.

13. An apparatus according to claim 8, wherein the latent image is formed in an area outside a predetermined exposure pattern formation range.

14. An apparatus according to claim 8, wherein the alignment is effected using the latent image, for all exposures except for a first pattern exposure.

15. An apparatus according to claim 8, wherein the pattern exposures of the multiplex pattern exposure are sequentially effected to a plurality of areas on the photosensitive substrate.

16. An exposure apparatus comprising:
  an exposure system for effecting a multiplex pattern exposure of a photosensitive substrate before development, the multiplex pattern exposure including a plurality of pattern exposures;
  a detection system for detecting a latent image of an alignment mark formed on the photosensitive substrate pattern; and
  an alignment system for effecting alignment between the photosensitive substrate and said exposure system using the latent image of the alignment mark detected by said detection system, the alignment between the photosensitive substrate and said exposure system being effected before at least one of the plurality of pattern exposures of the multiplex pattern exposure, wherein the latent image of the alignment mark is formed on the photosensitive substrate simultaneously with a previous one of the plurality of pattern exposures of the multiplex pattern exposure.

17. An apparatus according to claim 16, wherein the pattern exposures of the multiplex pattern exposure are sequentially effected on a plurality of areas of the photosensitive substrate.

18. An exposure apparatus for a pattern exposure of a photosensitive substrate, said apparatus comprising:
  a two-beam interference exposure portion for forming a pattern image on the photosensitive substrate using a light interference of two exposure lights;
  alignment detecting means associated with said two-beam interference exposure portion for detecting an alignment state of the photosensitive substrate at an exposure position of said two-beam interference exposure portion;
  an illumination optical system for illuminating a mask having at least one of a pattern and an alignment mark;
  a projection exposure portion for forming a pattern image on the photosensitive substrate using a projection optical system;
  alignment detecting means associated with said projection exposure portion for detecting an alignment state of the photosensitive substrate at an exposure position of said projection exposure portion; and
  a stage for holding the photosensitive substrate,
    wherein a position of the stage is controlled on the basis of a detection signal from said alignment detecting means associated with said two-beam interference exposure portion and/or said alignment detecting means associated with said projection exposure portion, and
    said alignment detecting means associated with said two-beam interference exposure portion and/or said alignment detecting means associated with said projection exposure portion includes latent image detecting means for detecting a latent image of the alignment mark, which latent image is formed on the photosensitive substrate simultaneously with a preceding pattern exposure of a multiplex pattern exposure.

19. An apparatus according to claim 18, wherein the alignment mark is formed outside a predetermined exposure pattern range by said projection exposure portion.

20. An apparatus according to claim 18, wherein said alignment detecting means associated with said two-beam interference exposure portion includes optical detecting means, and an optical axis of at least one optical system of the optical detecting means crosses with the pattern exposure position.

21. A device manufacturing method comprising:
  effecting, using exposure means, a multiplex pattern exposure on a photosensitive substrate before development, the multiplex pattern exposure including a plurality of pattern exposures, wherein alignment is effected between the photosensitive substrate and the exposure means using a latent image of an alignment mark formed on the photosensitive substrate, the alignment between the photosensitive substrate and the exposure means being effected before at least one of the plurality of pattern exposures of the multiplex pattern exposure, wherein the latent image of the alignment mark is formed on the photosensitive substrate simultaneously with a preceding one of the plurality of pattern exposures of the multiplex pattern exposure; and
  developing the photosensitive substrate having been subjected to the multiplex pattern exposure to form a pattern on the substrate and manufacturing a device using the photosensitive substrate having the pattern thus formed thereon.

22. A mask for use in at least one of a plurality of pattern exposures of a multiplex pattern exposure of a photosensitive substrate, before development of the photosensitive substrate, said mask comprising:
  pattern for the at least one pattern exposure; and
  a mark for forming, with said pattern, a latent image of an alignment mark on the photosensitive substrate for alignment between the photosensitive substrate and a pattern of a mask for use in another one of the plurality of pattern exposures of the multiplex pattern exposure, wherein the latent image of the alignment mark is formed on the photosensitive substrate simultaneously with said pattern for the at least one pattern exposure.

* * * * *

UNITED STATES PATENT AND TRADEMARK OFFICE
CERTIFICATE OF CORRECTION

PATENT NO.    : 6,344,892 B1
DATED         : February 5, 2002
INVENTOR(S)   : Mitsuro Sugita et al.

It is certified that error appears in the above-identified patent and that said Letters Patent is hereby corrected as shown below:

Column 1,
Line 49, "wave length" should read -- wavelength --; and "Solution." should read -- solution. --
Line 50, "wave length" should read -- wave length --.
Line 64, "portion s" should read -- portions --.

Column 2,
Line 14, "take" should read -- taken --.
Line 32, "f low" should read -- flow --.
Line 67, "Of" should read -- of --.

Column 3,
Line 63, "water" should read -- wafer --.
Line 67, "far" should read -- for --.

Column 4,
Line 20, "are" should read -- is --.
Line 37, "mars" should read -- mark --.

Column 5,
Line 28, "mar" should read -- mark --.

Column 6,
Line 18, "mass" should read -- mask --.
Line 58, "two-beam" should read -- two two-beam --.
Line 59, "water" should read -- wafer --.
Line 62, "patterns" should read -- pattern is --.

Column 8,
Line 13, "Mark," should read -- mark, --.
Line 62, "water." should read -- wafer. --.

Column 9,
Line 7, "Case," should read -- case, --
Line 39, "mass" should read -- mask --.

UNITED STATES PATENT AND TRADEMARK OFFICE
CERTIFICATE OF CORRECTION

PATENT NO. : 6,344,892 B1
DATED : February 5, 2002
INVENTOR(S) : Mitsuro Sugita et al.

It is certified that error appears in the above-identified patent and that said Letters Patent is hereby corrected as shown below:

Column 10,
Line 7, "905B" should read -- 906B --.
Line 34, "the." should read -- the --.
Line 35, "water" should read -- wafer --.
Line 56, "he" should read -- the --.
Line 60, "Is" should read -- is --.
Line 61, "need-of" should read -- need of --.
Line 64, "exposure. When" should read -- exposure. ¶When --.

Column 11,
Line 12, "With" should read -- with --.
Line 22, "the." should read -- the --.
Line 27, "or the mare" should read -- of the mark --.
Line 37, "Lark" should read -- mark --.
Line 47, "patter" should read -- pattern --.
Line 52, "water" should read -- wafer --.

Column 12,
Line 18, "Portion" should read -- portion --.

Column 14,
Line 6, "Image" should read -- image --.
Line 41, "it" should read -- is --.
Line 46, "Z(Pm))" should read -- E(Pm)) --.
Line 58, "mark." should read -- mark --.

UNITED STATES PATENT AND TRADEMARK OFFICE
CERTIFICATE OF CORRECTION

PATENT NO.   : 6,344,892 B1
DATED        : February 5, 2002
INVENTOR(S)  : Mitsuro Sugita et al.

It is certified that error appears in the above-identified patent and that said Letters Patent is hereby corrected as shown below:

<u>Column 15,</u>
Line 7, "met" should read -- set --.

Signed and Sealed this

Twenty-fourth Day of September, 2002

*Attest:*

JAMES E. ROGAN
*Director of the United States Patent and Trademark Office*

*Attesting Officer*